United States Patent [19]

Shapanus et al.

[11] Patent Number: 5,764,823
[45] Date of Patent: Jun. 9, 1998

[54] OPTICAL SWITCH FOR ISOLATING MULTIPLE FIBER OPTIC STRANDS

[76] Inventors: Vincent Shapanus, 716 Morning Side Dr., Towson, Md. 21204; Kevin Phipps, 1114 Halstead Rd., Baltimore, Md. 21234

[21] Appl. No.: 884,372

[22] Filed: Jun. 27, 1997

Related U.S. Application Data

[63] Continuation of Ser. No. 615,355, Mar. 13, 1996, abandoned, which is a continuation-in-part of Ser. No. 475,206, Jun. 7, 1995, abandoned, which is a continuation-in-part of Ser. No. 210,027, Mar. 17, 1994, Pat. No. 5,513,002.

[51] Int. Cl.$^6$ ............................................. G02B 6/35
[52] U.S. Cl. ................................................ 385/19; 385/16
[58] Field of Search ........................................ 385/15–23

[56] References Cited

U.S. PATENT DOCUMENTS

| | | | |
|---|---|---|---|
| 2,577,814 | 12/1951 | Saunderson et al. | 356/306 |
| 2,577,815 | 12/1951 | Saunderson et al. | 356/306 |
| 2,774,276 | 12/1956 | Glasser et al. | 356/405 |
| 2,951,164 | 8/1960 | Timms | 250/365 |
| 2,975,785 | 3/1961 | Sheldon | 600/141 |
| 3,144,551 | 8/1964 | Webb et al. | 356/307 |
| 3,244,894 | 4/1966 | Steele et al. | 250/277.28 |
| 3,407,323 | 10/1968 | Hand | 313/359.1 |
| 3,413,481 | 11/1968 | Berry | 250/226 |
| 3,527,954 | 9/1970 | Hoffman | 250/227.11 |
| 3,528,749 | 9/1970 | Bowker | 356/433 |
| 3,613,062 | 10/1971 | Bloice | 431/13 |
| 3,636,345 | 1/1972 | Hirschel | 250/296 |
| 3,684,378 | 8/1972 | Lord | 356/323 |
| 3,690,772 | 9/1972 | Endl | 356/408 |
| 3,824,391 | 7/1974 | Noltingk et al. | 340/578 |
| 3,973,849 | 8/1976 | Jackson et al. | 356/320 |
| 3,986,777 | 10/1976 | Roll | 356/405 |
| 4,047,819 | 9/1977 | Goldberg | 356/434 |
| 4,131,367 | 12/1978 | French et al. | 356/405 |
| 4,170,731 | 10/1979 | Howell et al. | 250/227.22 |
| 4,176,369 | 11/1979 | Nelson et al. | 257/228 |
| 4,280,184 | 7/1981 | Weiner et al. | 364/506 |
| 4,396,903 | 8/1983 | Habicht et al. | 382/103 |
| 4,555,800 | 11/1985 | Nishikawa et al. | 382/203 |
| 4,561,104 | 12/1985 | Martin | 382/152 |
| 4,575,241 | 3/1986 | Demers et al. | 356/316 |
| 4,591,231 | 5/1986 | Kaiser et al. | 385/19 X |
| 4,844,577 | 7/1989 | Ninnis et al. | 385/9 |
| 4,907,281 | 3/1990 | Hirvonen et al. | 382/100 |
| 4,912,326 | 3/1990 | Naito | 250/309 |
| 5,004,318 | 4/1991 | Ohasiti | 385/19 |
| 5,198,666 | 3/1993 | Bateman | 250/294 |
| 5,311,410 | 5/1994 | Hsu et al. | 362/20 |
| 5,513,002 | 4/1996 | Shapanus et al. | 356/313 |

FOREIGN PATENT DOCUMENTS

| | | | |
|---|---|---|---|
| 1387588 | 3/1975 | United Kingdom | 385/19 |

*Primary Examiner*—John D. Lee
*Attorney, Agent, or Firm*—Reed Smith Shaw & McClay

[57] ABSTRACT

An apparatus and method for selectively blocking optical light signals provided from a plurality of input fiber optical strands with an optical switch. An input fiber termination port is provided for coupling the plurality of input fiber optical strands to the optical switch. The input fiber termination port has a center and a plurality of rows of openings. Each of the rows of openings is aligned radially with respect to the center and has a plurality openings for receiving ends of the input fiber optical strands. An output fiber termination port is provided for coupling a plurality of output fiber optical strands to the optical switch. An interior optical path transmission region is bounded on a first end by the input fiber termination port and on a second end by the output fiber termination port. A movable light blocking structure is positioned within the interior optical path transmission region for selectively blocking the optical signals from passing between input fiber optical strands positioned along at least one of the rows of openings in the input fiber termination port and corresponding output fiber optical strands positioned in the output fiber termination port. An electromechanical actuator drives the movable light blocking structure in step-wise angular increments, wherein the step-wise angular increments correspond to an angular distance between adjacent rows of openings in the input fiber termination port.

25 Claims, 24 Drawing Sheets

OPTICAL SWITCH FOR ISOLATING MULTIPLE FIBER OPTIC STRANDS

CROSS-REFERENCE TO RELATED APPLICATION

This application is a continuation of application Ser. No. 08/615,355 filed on Mar. 13, 1996 (abandoned), which is a continuation-in-part of U.S. patent application Ser. No. 08/475,206, filed Jun. 7, 1995, entitled "Optical Switch," which is a continuation-in-part of U.S. patent application Ser. No. 08/210,027, filed Mar. 17, 1994, entitled "Optical Corona Monitoring System," U.S. Pat. No. 5,513,002, the contents of which are hereby incorporated herein in their entirety by reference.

FIELD OF THE INVENTION

This invention relates to monitoring of physical conditions within a predetermined space by collection and detection of optical radiation emitted within the space. More particularly, this invention relates to monitoring the condition of a piece of electrical equipment by collecting and detecting optical radiation generated at various locations on or in the equipment. Still more particularly, this invention relates to monitoring an electrical machine, such as a generator, to determine the existence of corona discharge, electrical arcing, flame ignition combustion, or smoldering conditions, by collecting light emitted at various locations within the machine and analyzing the collected light to determine whether its characteristics are consistent with such conditions. As used herein, "optical radiation" and "light" include visible light and adjacent wavelength ranges of electromagnetic radiation.

BACKGROUND OF THE INVENTION

There is a great need to determine the condition of certain electrical equipment such as generators and motors. High voltage generators such as are used by electric power utilities are subject to faults and deterioration which can be relatively easily corrected if detected sufficiently early but which can lead to catastrophic failure if left uncorrected. A variety of techniques have been employed to monitor the condition of such equipment in order to evaluate whether or when maintenance should be performed. Such techniques generally measure, directly or indirectly, the quality of the electrical insulation of the equipment. A high voltage generator, such as a 13.2 kV generator used by an electrical utility, includes insulated conductors which are disposed in slots in laminated steel structures. During generator operation, the insulation is subjected to a very large cyclic compressive load. This is a result of the mechanical forces generated by the interaction between the electrical current in the conductor and the magnetic field. Such stresses, together with time and environmental conditions, eventually result in deterioration of the insulation sufficient to permit corona generation. For purposes of the present invention, the term "corona" means a localized electrical discharge in a gaseous region adjacent an electrical circuit which occurs due to transient ionization of the gas when the voltage stress in the gas exceeds a critical value, for instance an electric field of about 3000 V/m in air. The corona itself typically causes further insulation degradation which, if unabated, will result over time in an arc, spark or flame in the equipment which causes an equipment failure. Thus, for purposes of the present invention, a corona or corona ionization may be thought of as a first step in an evolutionary process which, in time, may result in an arc, spark or flame in the equipment being monitored. Although the term "corona" may be used to refer to internal discharges, such usages of "corona" must be distinguished from corona which occurs externally. External corona refers to characteristics of the corona phenomenon which occur on the surface of the insulation. External corona is sometimes referred to as partial discharge. Corona that is not visible because it is internal to a material or device can also be referred to as partial discharge. In this specification, "corona" refers to external corona, i.e., exposed ionization. While certain measures can be taken to suppress external corona ionization, such as applying semiconductive paint over the insulation, they generally merely extend the time until corona occurs.

In rotating machinery, such as high-voltage motors or generators, conductors are insulated with layers of insulating, tape which is mica based and impregnated with a polymer that has a high dielectric strength which is inherent to the monomer components of the polymer or to the modifiers which may be added to increase the dielectric strength upon polymerization of the monomer compound. Conductors that have been treated with an insulating system are driven into the slots in laminated steel structures. These stator-bar conductors must carry a cyclic compressive load. This is a result of the transmission of mechanical forces resulting from the interaction of the current and magnetic field to the iron of the generator or the opposite affect. Semiconductive paints are used to suppress corona between the insulation system and the slots. In most cases, the paint is vaporized over prolongation of the ionization. Corona is undesirable and will degrade the insulation due to ion bombardment over time.

Currently, insulation can be divided into six classes. However, these six classes have yet to become the industry standard. The industry is currently using four class divisions. Class A insulation is comprised of organic materials such as cotton, paper and silk. This type of insulation is not used in new generators. Class B insulation is a group consisting of synthetic materials such as mica, glass fiber and epoxy. Some organic materials are also included in this class. Class B insulation is the most widely used insulation today. Class F insulation is made up of similar materials that are in Class B insulation. These materials have different characteristics than those in Class B. Generally, Class F insulation can withstand an additional 25 degrees centigrade over Class B insulation. Class H insulation is also comprised of similar materials as in Class B insulation. Class H insulation has additional additives that suppress combustion. The proposed six class division separates Class H insulation into two other classifications that are loosely based on further temperature divisions. Insulation systems are usually mica or mica based products which have been impregnated with a plastic in a compression process. Insulating tapes used in an insulation system that covers the outer surface of conductors contain inorganic materials, even so, corona ionization will eventually occur on such materials.

Corona is a serious problem, and can lead to rapid and catastrophic failure of a generator. Accordingly, generator condition monitoring has included corona detection and monitoring of corona-related conditions. For the most part, prior corona detection techniques have required the generator to be taken out of service, which is a substantial disadvantage. One technique is to visually inspect the generator windings to detect the effects of corona on the insulation; corona may leave a white residue. Visual inspection may require substantial disassembly of the generator to access locations where corona may occur, and the visual evidence of corona may be overlooked. Another corona detection technique which requires the generator to be out of service is electrical measurement of the insulation electrical characteristics from which inferences regarding the insulation quality and susceptibility to corona may be drawn. D.C. potentials may be applied to the windings for measurements of charging and static resistive currents; A.C. potentials may be applied to the windings to make insulation power factor measurements; or overvoltages may be applied to determine if the insulation can survive them. A further drawback of these electrical testing methods is that they do not provide information regarding the physical location at which an insulation problem may exist; thus they do not provide information to direct repair and maintenance activities to the appropriate locations. Other techniques may be used to detect corona based on the effects it produces while it is occurring; these include detecting radio or ultrasonic noise emitted by the corona. These monitoring techniques also require the electrical load to be removed from the generator, and it is still difficult to locate a corona-generating region using them. Coronas generate ozone, and the tell-tale odor of ozone has long been used as an indicator of corona. It is difficult to quantify the degree of insulation deterioration and to localize a deteriorated area by detecting coronagenerated ozone.

Corona also generates light, and corona detectors which acquire and detect light have been used in research studies regarding corona physics. However, to date optical corona detectors have not been available which can detect corona in an operating electrical machine such as a generator and determine the location where the corona exists.

Utility generators can be taken off line for inspection, testing, maintenance, and repair in the spring and fall, when demand is relatively low, but it is inconvenient and expensive to do so in the summer and winter peak demand seasons. Accordingly, the generators are typically kept on line during the peak seasons, and any minor insulation defects which are overlooked or are incipient and undetectable in the spring and fall can grow to serious or catastrophic problems during the following peak season. Such problems are exacerbated by the fact that there is presently negligible construction of new power plants in the United States; old plants and their generators are therefore being kept on line indefinitely, and the aging equipment is increasingly susceptible to insulation deterioration. When a catastrophic generator failure occurs, it can require eighteen months off line and tens of millions of dollars to repair.

Accordingly, there is a great need for a system for continuously monitoring the condition of a generator while it is in normal operation, which can detect and evaluate the severity and location of corona and related conditions, so that problems can be identified early, monitored during their evolution, emergency action can be taken if necessary, and otherwise repair and maintenance can be scheduled when appropriate, performed efficiently and effectively, and orderly utility operations maintained.

It is therefore an overall object of the invention to provide a system for detecting corona in electrical machinery while the machinery is in normal operation.

It is a further object of the invention to provide a system which can detect arcing, flame ignition combustion, and smoldering conditions as well as corona.

It is another object of the invention to provide a system for detecting corona ionization emissions from an electrical power generator, which system can be installed on the electrical power generator without modifying or altering the design or structure of the generator.

It is another object of the invention to provide a system which can determine the location(s) within the machinery at which corona or other insulation defect-related conditions are occurring.

It is another object of the invention to provide such a system which can determine the identity of materials which are involved in corona or other insulation defect-related conditions.

It is another object of the invention to enhance the optical visibility of corona ionization emissions that occur within electrical power generating equipment by treating the insulation used in such equipment with materials which emit a distinctive optical signature during corona ionization emissions.

It is another object of the invention to provide such a system which displays information relating to the intensity and location of corona or other insulation defect-related conditions.

It is another object of the invention to use a single optical sensor which is coupled to a plurality of fiber optical devices with different fields of view for monitoring and determining the location(s) within the machinery where corona ionization emissions are occurring. It is a still further object of the present invention to provide means for selectively suppressing optical signals from one or more of such fiber optical signals from reaching the single optical sensor. It is yet a further object of the present invention to provide means for optically isolating different optical signals from the plurality of fiber optical devices on discrete non-overlapping areas of the single optical sensor.

It is another object of the invention to provide such a system which stores information relating to the condition of the monitored electrical machinery.

It is another object of the invention to provide such a system which is rugged and can reliably operate in the hostile environment of many electrical machines.

The foregoing and other objects of the invention will be understood with reference to the following specification and claims and the drawings.

SUMMARY OF THE INVENTION

The present invention is directed to a method and apparatus for selectively blocking optical light signals provided from a plurality of input fiber optical strands with an optical switch. An input fiber termination port is provided for coupling the plurality of input fiber optical strands to the optical switch. The input fiber termination port has a center and a plurality of rows of openings. Each of the rows of openings is aligned radially with respect to the center and has a plurality openings for receiving ends of the input fiber optical strands. An output fiber termination port is provided for coupling, a plurality of output fiber optical strands to the optical switch. An interior optical path transmission region is bounded on a first end by the input fiber termination port and on a second end by the output fiber termination port. A movable light blocking structure is positioned within the interior optical path transmission region for selectively blocking the optical signals from passing between input fiber optical strands positioned along at least one of the rows of openings in the input fiber termination port and corresponding output fiber optical strands positioned in the output fiber termination port . An electromechanical actuator drives the movable light blocking structure in step-wise angular increments, wherein the step-wise angular increments correspond to an angular distance between adjacent rows of openings the input fiber termination port.

In accordance with a further aspect, the present invention is directed to an optical switch for selectively blocking optical light signals provided from a plurality of input fiber optical strands. An input fiber termination port is provided for coupling the plurality of input fiber optical strands to the optical switch. The input fiber termination port has openings aligned along a plurality of perpendicularly aligned rows and columns. Each of the rows and each of the columns have a plurality of openings for receiving ends of the input fiber optical strands. An output fiber termination port is provided for coupling a plurality of output fiber optical strands to the optical Switch. An interior optical path transmission region is bounded on a first end by t he input fiber termination port and on a second end by the output fiber termination port. A plurality of independently movable light blocking structures are positioned parallel to the rows. Each of the movable light blocking structures may be slid within the interior optical path transmission region along an axis parallel to the rows. Each of the independently movable light blocking structures functions to selectively block optical signals from passing between input fiber optical strands positioned along at least one row of the input fiber termination port and corresponding output fiber optical strands positioned in the output fiber termination port when an independently movable light blocking structure is positioned at least partially within the interior optical path transmission region.

DETAILED DESCRIPTION OF THE INVENTION

While the following description may refer specifically to the monitoring of a generator, it will be understood that the system of the invention may be used to monitor other electrical machinery and equipment.

Figure 1:
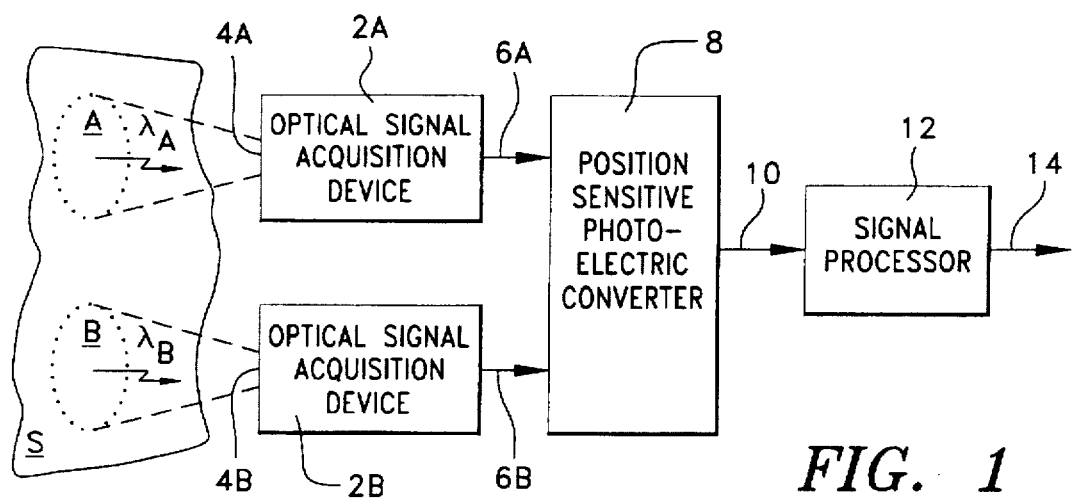
FIG. 1 is a schematic diagram illustrating a system f or monitoring the condition of a piece of electrical equipment in accordance with a preferred embodiment of the present invention.

Referring now to FIG. 1, there is shown a schematic diagram illustrating a system for monitoring the condition of a piece of electrical equipment in accordance with a preferred embodiment of the present invention. The system includes a monitoring instrument, a portion of which is disposed adjacent to a surface S which is to be monitored. Surface S includes a plurality of areas, areas A and B being shown, which are to be separately monitored. Areas A and B may, for example, be different areas within a generator or other electrical machinery or equipment. The system includes a plurality of optical signal acquisition devices, 2A and 2B being shown, which are disposed and adapted to separately receive optical radiation, indicated as $\lambda A$ and $\lambda B$, emitted in their direction from the corresponding areas A and B to be monitored. Optical signal acquisition device 2A includes an aperture 4A through which it receives light from a field of view which includes area A on surface S, and optical signal acquisition device 2B includes an aperture 4B through which it receives light from a field of view which includes area B of surface S. Optical signal acquisition devices 2A and 2B are preferably disposed with respect to surface S so that the areas A and B in their respective fields of view are different, although they may overlap. The optical radiation received by optical signal acquisition devices 2A and 2B is separately conveyed over optical communication channels 6A and 6B to a position-sensitive photoelectric converter 8, so as to preserve the spatial information regarding the source of the light. Although optical signal acquisition devices 2A and 2B are required to be adjacent the surface to be monitored, which is often a hostile environment, the optical communication channels 6A and 6B permit the photoelectric converter and associated electronics to be disposed in a remote location which is likely to be less hostile. Converter 8 converts the optical radiation received from the optical communication channels 6A and 6B into an electrical signal in electrical communication channel 10, the electrical signal includes separate information representing the intensity of light received from each of the optical communication channels 6A and 6B (and thus from each of the monitored areas A and B). A signal processor 12 receives the output electrical signal from converter 8 and processes it to obtain information, such as, for example, whether corona, arcing, flame ignition combustion, or smoldering conditions exist at any of the areas being monitored, the location of such conditions, the severity of such conditions, and the nature of materials involved in such conditions, and provides an output 14 representing such information. Output 14 desirably includes a visual display. Thus, the system of the present invention includes means for separately acquiring and processing optical radiation acquired from each of the monitored areas A and B to provide an output 14 separately indicating the nature of the optical activity in each monitored area.

Figure 2:
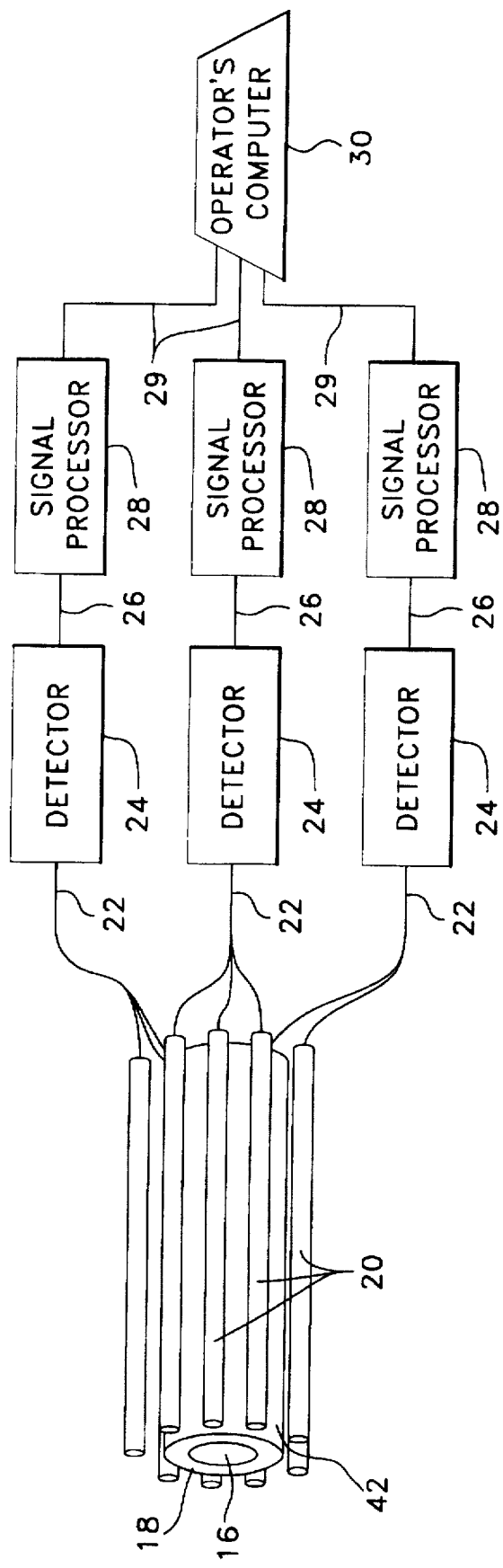
FIG. 2 is a further schematic diagram illustrating a system for monitoring the condition of a piece of electrical equipment in accordance with a preferred embodiment of the present invention.

Referring now to FIG. 2, there is shown a further schematic diagram illustrating a system for monitoring the condition of a piece of electrical equipment in accordance with a preferred embodiment of the present invention. In the preferred embodiment of the present invention, a plurality of optical acquisition devices (each of which has a different field of view) are used to form an optical probe 20. Thus, the optical acquisition devices in a probe 20 are disposed along a plurality of locations so as to receive light from a plurality of areas in the monitored equipment. In order to further increase the number of areas on the equipment being monitored, a plurality of optical probes 20 are preferably disposed in an array around the equipment. The fibers for an optical acquisition device in a probe 20 thus function both as sensors or light acquisition devices, which separately acquire light from different monitored areas, and as optical communication channels, which separately convey the light to a detector, thus preserving the spatial information regarding the location at which received light was emitted. Each optical acquisition device may be formed by a single optical fiber or by a plurality of fibers in an optical cable which, for purposes of this invention, function effectively as a single fiber and may be referred to for convenience as a fiber.

Referring still to FIG. 2, the equipment monitoring system of the present invention comprises one or more probe devices 20, fiber optical cable assemblies 22, detector units 24, communication channels 26, initial signal processing devices 28, and an operator's signal processing device or computer 30. An exemplary generator to be monitored by the equipment monitoring system of the present invention includes a stator 18 and a rotor 16 which is rotatably disposed, by means not shown, within the stator 18. The insulation surrounding the windings of the stator 18, on the generally cylindrical surface 42, are subject to corona ionization and like problems. To monitor the condition of the windings and their insulation during operation of the generator, a plurality of probes 20 are disposed around the outside of stator 18 so as to receive optical radiation generated by the windings. Such probes 20 may be supported by and within a generator housing, not shown, in the space between the inner surface of the generator housing and the winding surface 42. Several preferred arrangements for supporting probes 20 within the generator housing are discussed below in connection with FIGS. 7–9. It should be noted that the rotor 16 could be similarly monitored by disposing probes 20 in the space (not shown) between the rotor 16 and stator 18, although such monitoring is more complicated due to the movement of the rotor. Since optical radiation detection requires a line-of-sight relationship between the probe and the monitored surface, a cylindrical array of probes 20 are required to cover the entire circumference of the stator 18. The fibers 34 (shown in FIG. 3) from a probe 20 exit the probe structure itself and continue (either directly or through connectors) in fiber optical cable assemblies or bundles 22 to a detector 24, to convey the optical radiation received at the probe ends 24 of the fibers 34 to a photoelectric converter within the detector 24. The electrical output of detector 24 is coupled by an electrical communication channel 26 to a signal processor 28.

The operator's computer 30 receives the processed signals from each signal processor 28 over communication channels 29, and provides an operator interface including a visual display and operator input, such as by a keyboard. It will be understood that the functions of the detector, signal processor, and operator's computer as described herein need not be performed by separate pieces of equipment; for instance, a single piece of equipment could include all detectors, signal processing, and operator interface. Thus, the signal processors 28 and operator's computer 30 of FIG. 2 correspond to the single signal processor block 12 shown in FIG. 1.

The number and arrangement of the components will depend in large part on the specifics of the measuring application and design choices in the equipment selected for the application. The position-sensitive photoelectric converter selected will be characterized by its number of detecting elements, their size and their spacing, and these factors determine the number of the selected optical fibers which it can separately detect and consequently the number of separate areas in the generator which it can monitor. A plurality of detectors, as shown in FIG. 2, may be required depending on the number of monitored locations in the system and the number of fibers which can be handled by each detector 24. If a plurality of detectors 24 is used, then it may be desirable as shown to utilize a separate signal processor 28 coupled to each detector 24 to process the signals therefrom.

In routing the optical fibers between the probes 20 and the detectors 24, in a given application, the terminal configurations are more or less predetermined; each of the fibers from a probe must be conveyed to one of the detectors, and a set of fibers from one or more probes must be provided to each detector, the set being chosen to efficiently and effectively use the photosensitive area of the detector. Various options exist in between the terminal ends for grouping and routing the fibers. As illustrated in FIG. 2, the fibers from a set of probes; intended for a particular detector may be grouped near the generator and conveyed as a separate bundle 22 to the selected detector 24. Alternatively, all fibers could be grouped in a single bundle and conveyed to the detectors, and split into separate bundles 22 adjacent the detectors. In either event, the fibers are desirably run in a protective conduit between the generator and the detectors.

In order to provide position information regarding an event, the system must be able to correlate a detected optical signal with the location of a particular probe fiber which acquired the detected light. This may be accomplished by controlling the routing of the fibers between the probes and the detectors so that a fiber from predetermined probe location is made to illuminate a particular detector area. Alternatively, and preferably, the fibers may be routed in a random or uncontrolled manner, and the correlation between probe location and detector location determined afterward by selectively illuminating single probe fibers and determining which detector locations respond. Data obtained in this process may be stored in a lookup table or the like and thereafter used during monitoring to associate detector outputs with equipment locations.

Figure 3:
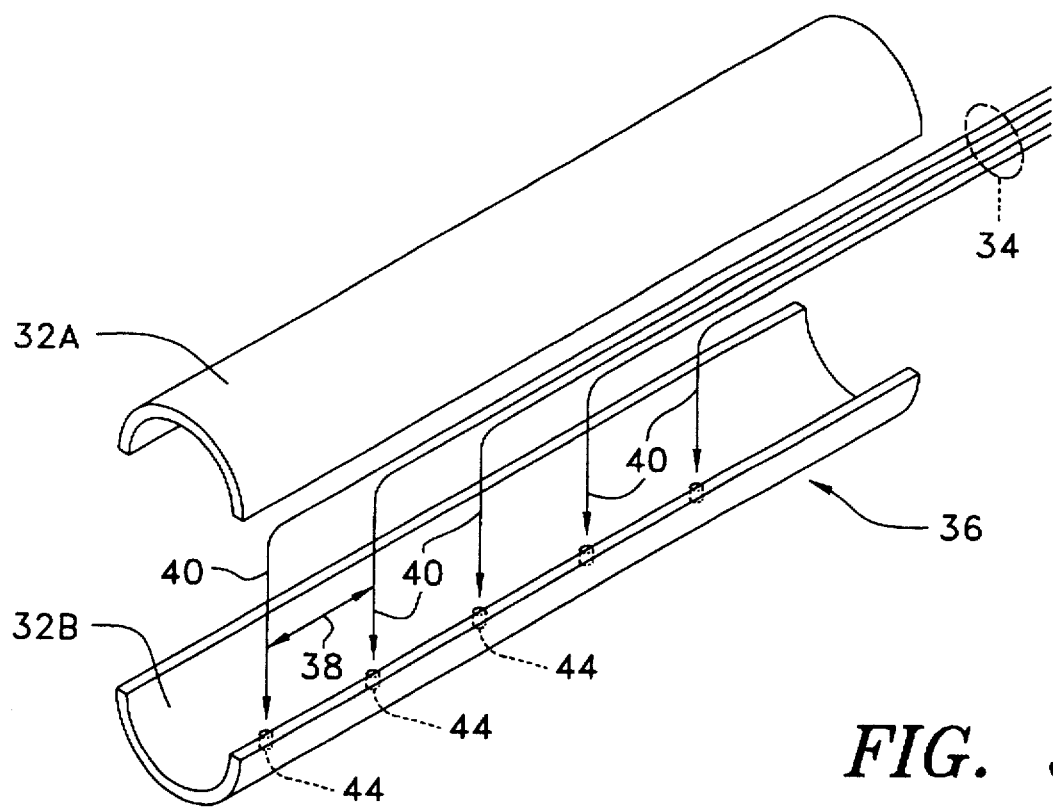
FIG. 3 is an exploded perspective view of a preferred optical probe for acquiring optical radiation from multiple areas on a piece of electrical equipment in accordance with a preferred embodiment of the present invention.

Referring now to FIG. 3, there is shown an exploded perspective view of a preferred optical probe 20 for acquiring optical radiation from multiple areas on a piece of electrical equipment in accordance with a preferred embodiment of the present invention. In the preferred embodiment, the light acquisition devices 34 in each elongated probe 20 collectively receive light from substantially the entire length of the stator 18, but from only a portion of the circumference of the stator 18 Probes 20 may be made with a simple and rugged structure which is conveniently mounted in the available space between the generator housing and the stator 18. Each probe 20 includes a plurality of optical fibers 34 having fiber ends 40 which are directed toward the end winding surface 42 to receive light generated at the surface.

In a preferred embodiment of probe 20, a plurality of optical fibers 34 are disposed at predetermined positions in a support structure 32. Support structure 32 includes a length of tubing, which may be longitudinally sectioned for convenience in fabrication to provide an upper portion 32A and a lower portion 32B. The tubing is preferably made of a nonconductive material, and PVC is believed to be suitable. Optical fibers 34 are assembled in tubing 32 with the terminal ends 40 of the fibers at a longitudinal spacing 38. A terminal end 40 of each fiber is inserted into a preexisting radial hole 44 in the bottom half section 32B of the tubing 32, a plurality of such holes 44 being provided at a spacing 38 so as to establish the spacing of fiber ends 40 along the length of the probe. The top half section of the tubing 32A is then attached to the bottom half 32B. The tubular member 32 thus formed is then "potted" or filled with a nonconductive material to fill all voids between fibers and give the assembled probe structural integrity. So constructed, the detecting fibers 34 are incorporated into a unitary, self-contained, integral, sensor-containing structure such as is commonly referred to in instrumentation as a "probe," as distinguished from an assemblage of mechanically separate components. Polyurethane and epoxy are believed to be suitable materials for filling the voids in the probe structure. The elongated cylindrical probe 20 so constructed may be made with a sufficiently small diameter as to easily fit within generators and the like and sufficiently rugged to survive in such a hostile environment. Such a probe 20 permits sensitive detecting equipment to be remotely mounted in a less hostile environment.

Referring still to FIG. 3, the fibers 34 are brought out of an exit end 36 of probe 20 which may be provided with probe-mounting or fiber conduit-interfacing structure as desired. Commercially available optical fiber cables are conveniently used in the probe structure. Such cables include a plurality of individual optical fibers which are enclosed within protective jacketing. A suitable optical fiber material is that supplied by Edmund Scientific Co. under its stock number D2536-37, which is a cable containing a strand of 16 plastic fibers in its jacket with a strand diameter of 1 mm. No doubt many other optical fibers are suitable. If attenuation losses over the generator-detector distance are substantial, glass fibers may be preferable. The 1 mm strand diameter of the referenced optical fiber material is believed suitable for use as; a single "fiber" 34, both in terms of the light collection area of the strand end and the ruggedness and ease of handling it provides. Such a fiber material may be brought in its jacket to or through a hole 44. If a multiple-fiber cable is to monitor plural areas—for instance, if each fiber from a 16-fiber strand is to monitor one of 16 separate areas—then each of the fibers 34 of the strand must be separated from the bundle in order to be disposed within a separate radial hole 44. In that arrangement, a jacketed portion of the cable may extend partially within the probe at the exit end 36 so as to be surrounded by potting material and provide a rugged connection between the cable and the probe.

Figure 4:
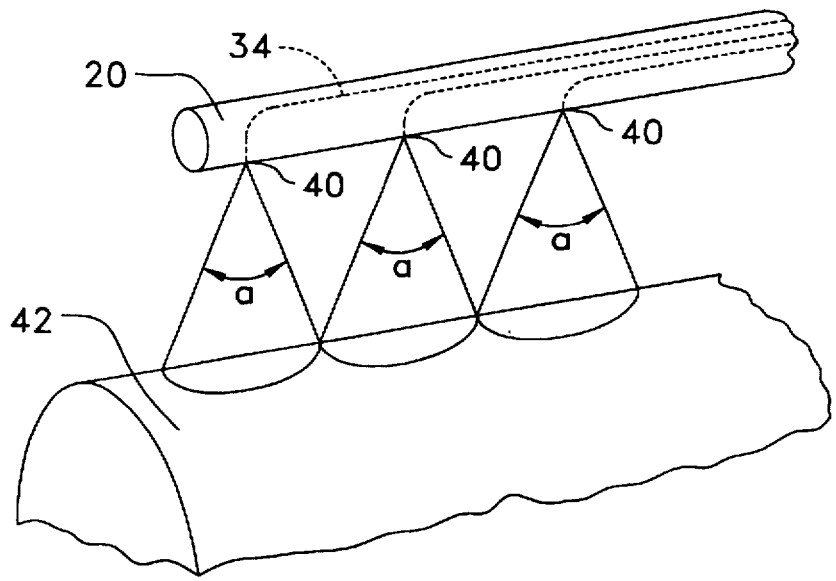
FIG. 4 is a schematic diagram illustrating the light acceptance cones of a preferred optical probe for acquiring optical radiation from multiple areas on a piece of electrical equipment in accordance with a preferred embodiment of the present invention.

Referring now to FIG. 4, there is shown a schematic diagram illustrating the light acceptance cones of a preferred optical probe 20 for acquiring optical radiation from multiple areas on a surface 42 of a piece of electrical equipment in accordance with a preferred embodiment of the present invention. Each fiber end 40 defines an aperture through which optical radiation may be admitted into a fiber 34. Each fiber 34 has a given ability to collect, and to convey through its length, photons that have optical paths that lie completely in a cone which has its apex at the fiber tip 40 and its base at the generator end winding surface 42. This cone is referred to as the acceptance cone of the fiber, and the angle of the acceptance cone is referred to as the acceptance angle. The acceptance angle of the particular fibers referred to above is 60 degrees.

The acceptance cone angle "a" and the separation between the fiber end 40 and the monitored surface of the generator end windings 42 determine the area covered by each fiber 34, i.e., the area on the surface 42 from which it collects photons. It is generally desirable to cover substantially the entire area of the monitored surface. For a given acceptance angle, surface area to be monitored, and probe separation from the monitored surface, the separation between fiber ends and the number of fibers required for substantially complete coverage is determined. The fiber ends 40 will normally be flat surfaces, but in order to modify the acceptance cone angle they may be terminated with a curved surface or provided with auxiliary optics. In the preferred arrangement of the invention, the end 40 of each fiber 34 is positioned at a distance 38 (shown in FIG. 3) from the end 40 of the adjacent fibers so that the base of each acceptance cone is generally tangent to the adjacent base. To minimize the number of fibers while obtaining substantially total coverage, the separation between the ends 40 of the fibers 34 and the generator end winding surface 42 is maximized to the extent permitted by the desired spatial resolution.

Figure 5:
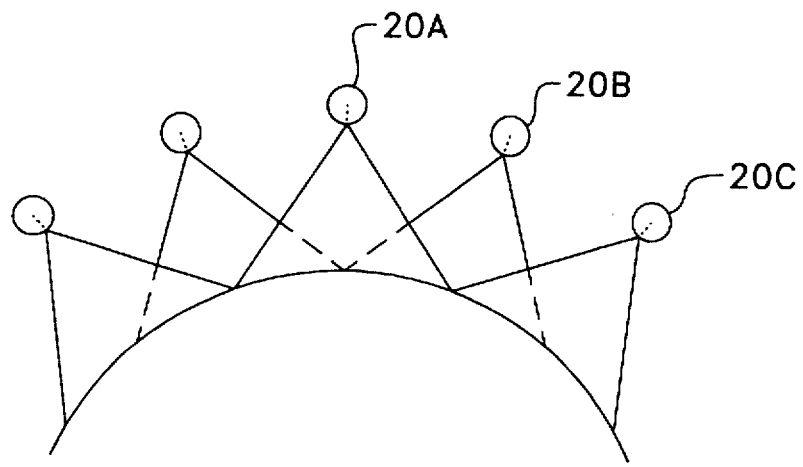
FIG. 5 is an axial diagram of a generator stator showing the acceptance cones of an array of optical probes for acquiring optical radiation from multiple areas on a piece of electrical equipment in accordance with a preferred embodiment of the present invention.
Figure 6:
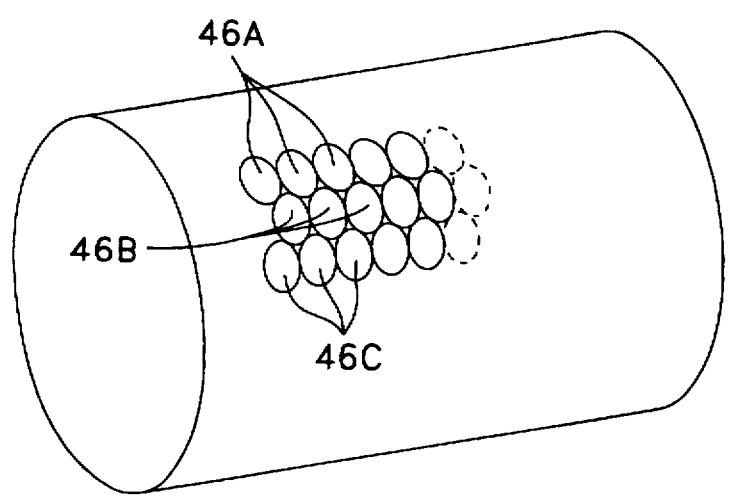
FIG. 6 is a perspective diagram of a generator stator showing the areas on the end windings thereof which lie within the acceptance cones of the probe array of FIG. 5.

Referring now to FIGS. 5 and 6, there are shown axial and perspective diagrams; of a generator stator showing the acceptance cones of an array of optical probes 20 for acquiring optical radiation from multiple areas on a winding surface 42 of a piece of electrical equipment in accordance with a first preferred embodiment of the present invention. As shown in FIGS. 5 and 6, the probe devices 20A, 20B, 20C . . . , preferably are placed inside a generator housing in such a way that the bases of the acceptance cones of one probe device (e.g. 46B) interlock with the bases of the acceptance cones of the adjacent parallel probes (e.g. 46A and 46C). This provides a pattern of acceptance cone bases in the nature of a hexagonal close packing and provides substantially complete coverage without overlap.

Figure 7:
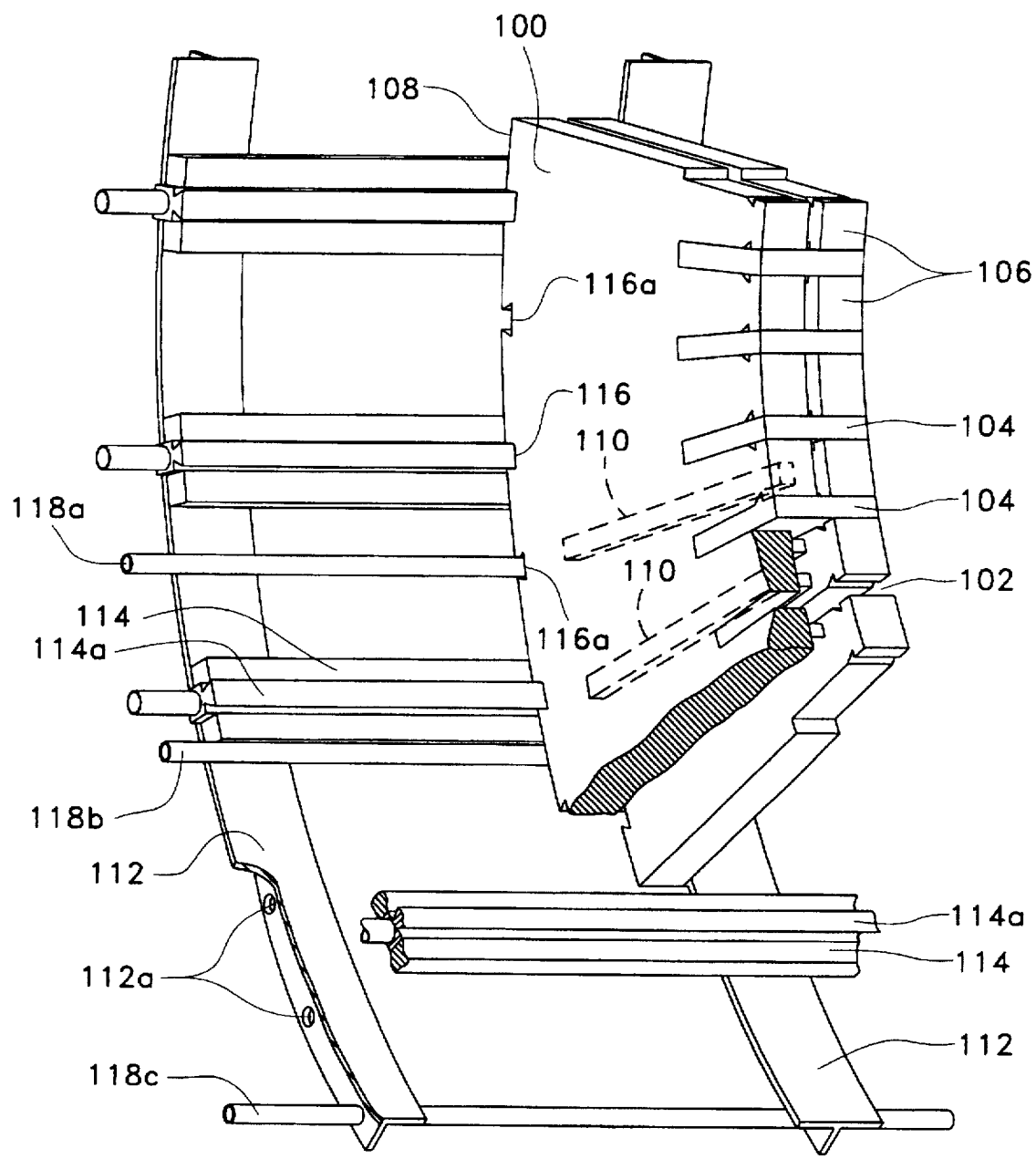
FIG. 7 is a cut-away view of a stator core punching assembly illustrating the preferred locations for mounting an optical probe on a piece of electrical equipment in accordance with an alternative preferred embodiment of the present invention.

Referring now to FIG. 7, there is shown a cut-away view of a stator core punching assembly 100 illustrating three preferred locations for mounting an optical probe 20 on a piece of electrical equipment in accordance with the present invention. Stator core punching assembly 100 is formed of a plurality of winding slots 102. Each of the winding slots 102 is sized to receive and hold a generator winding 104. As explained more fully below, each generator winding is formed of one or more conductor wires surrounded by several layers of electrical insulation. The winding core slots 102 lie along the interior cylindrical surface 106 of stator core punching assembly 100. The stator core punching assembly 100 has an outer cylindrical surface 108 which is positioned opposite and outside of interior surface 106. Stator core punching, assembly 100 has a plurality of hollow vent openings 110 that extend radially from outer surface 108 toward inner surface 106.

The stator core punching assembly 100 is affixed to a section frame (not shown) by section plates 112 and key bars 114. The key bars 114 are rigidly affixed to section plates 112 and run perpendicular to the section plates. Each key bar 114 includes a dove-tail joint 114a running along the length of the key bar. Each dove-tail joint 114a is sized so as to engage within one of the dove-tail grooves 116 in stator core punching assembly 100. Key bars 114 are spaced around stator core punching assembly 100 such that every other dove-tail groove 116 in a stator core punching assembly 100 is coupled with a corresponding dove-tail joint 114a from a key bar. For purposes of the present invention, each dove-tail groove in stator assembly 100 that is not occupied by a dove-tail joint 114a will be referred to as a "vacant" dove-tail groove 116a.

Figure 8:
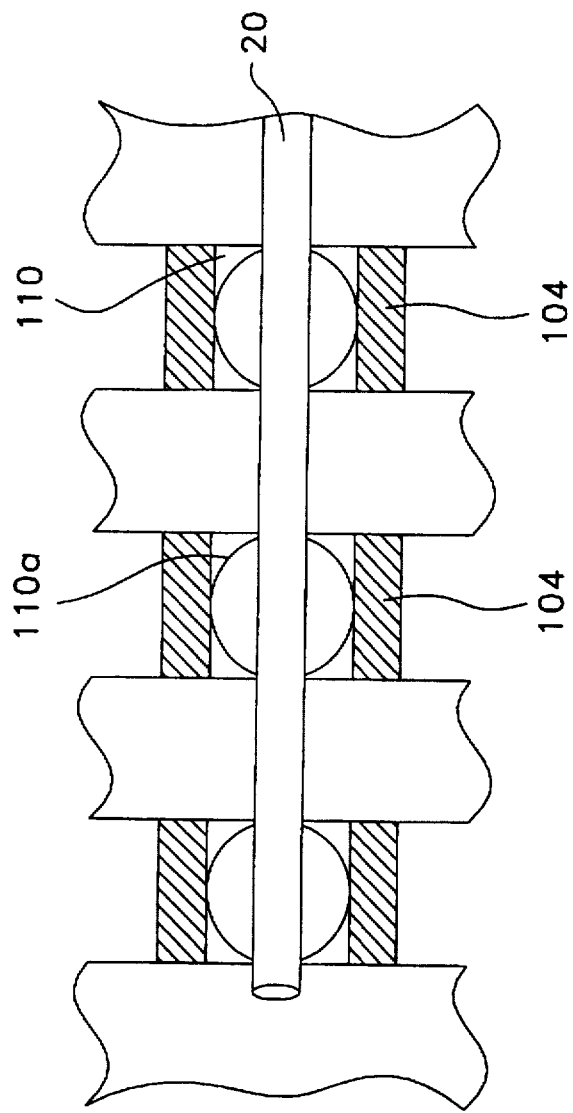
FIG. 8 is a top view looking through a vacant dove-tail groove and into a vent hole opening of the stator core punching assembly of FIG. 7, and showing a field of view of an exemplary optical acquisition device of an optical probe in accordance with an alternative preferred embodiment of the present invention.

Each hollow vent opening 110 extends from a dove-tail groove 114, 114a toward the interior surface 106 of stator core punching assembly 100. Referring now to FIG. 8, there is shown a top view looking downwardly through a vacant dove-tail groove 116a and into a hollow vent hole opening 110 of stator core punching assembly 100. In accordance with a preferred embodiment, an optical fiber 34 from a probe 20 is positioned at or near a vacant dove-tail joint 116a with its termination end 40 aimed downwardly into the hollow vent hole opening 110 such that the bottom-most portion of the acceptance cone of the fiber 34 is defined by circle 110a. Since corona emissions or other optical radiation emitted from a winding 104 will typically fall between winding slots 102, an optical fiber end 40 properly positioned adjacent a dove-tail groove 116a and aligned to look downwardly through a vent hole opening 110 will have a field of view sufficient to acquire and collect such optical emissions.

Referring again to FIG. 7, there are shown three alternative arrangements for mounting a probe 20 so that its optical fiber ends 40 lie adjacent to and may be aligned to look downwardly through vent hole openings 110. In the first arrangement (shown in connection with probe 118a), probe 118a is mounted within a vacant dove-tail groove 116a such that its optical fiber termination ends 40 face and are aligned with the vent hole openings connected to a vacant dovetail groove 116a. In the second arrangement (shown in connection with probe 118b), probe 118b is mounted on and parallel to a key bar 114 such that its optical fiber termination ends 40 are facing and aligned with vent hole openings 110 adjacent to the probe. In the third arrangement (shown in connection with probe 118c), probe 118c is mounted on and perpendicular to section plates 112 by passing probe 118c through cooling holes 112a on the section plates. Again, in this third arrangement, probe 118c is mounted such that its optical fiber termination ends 40 are facing and aligned with vent hold openings 110 adjacent to the probe. Probes 118a, b, c are substantially identical to probe 20 described above.

Figure 9:
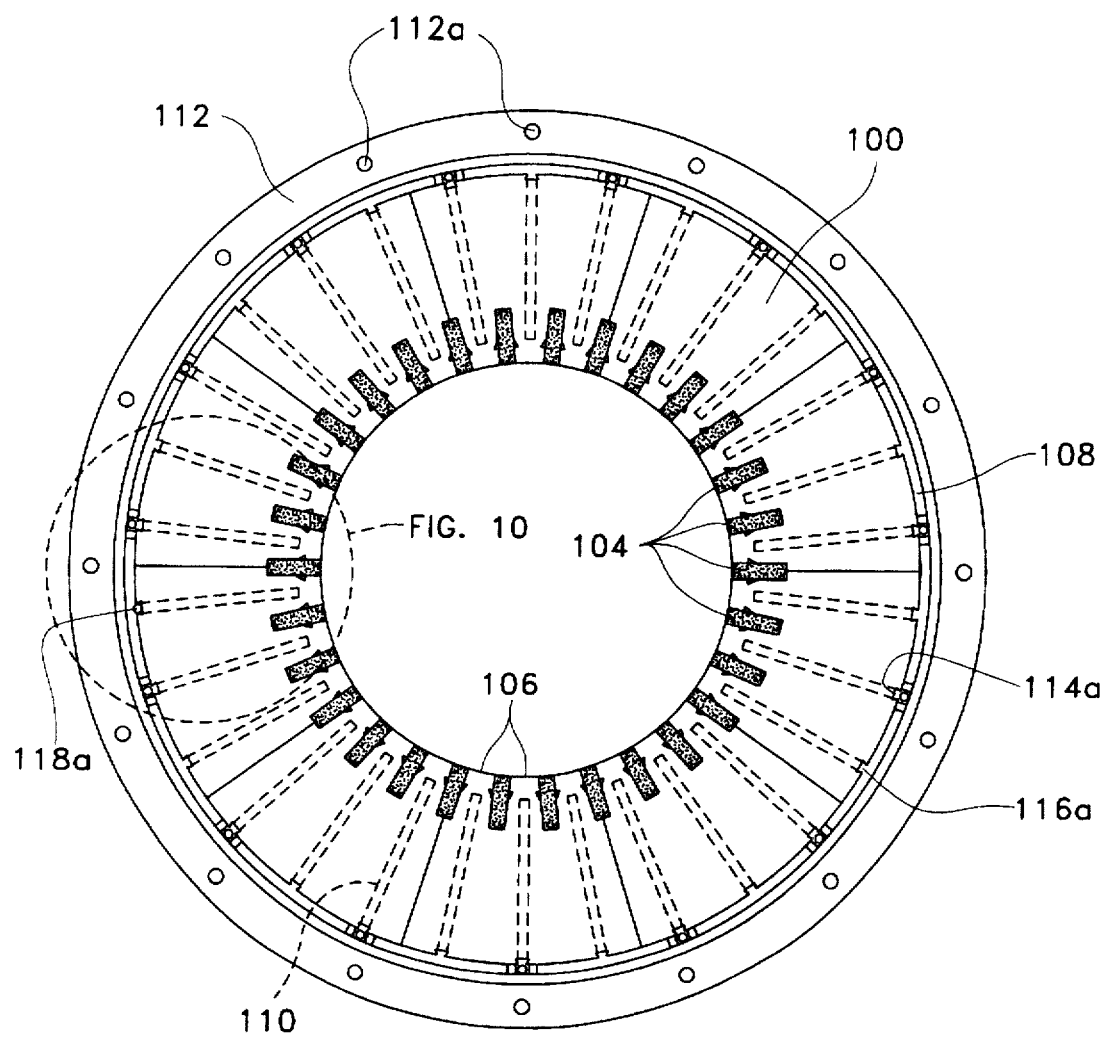
FIG. 9 is a cross-sectional view of an array of optical probes positioned around a generator stator assembly in accordance with an alternative preferred embodiment of the present invention.
Figure 10:
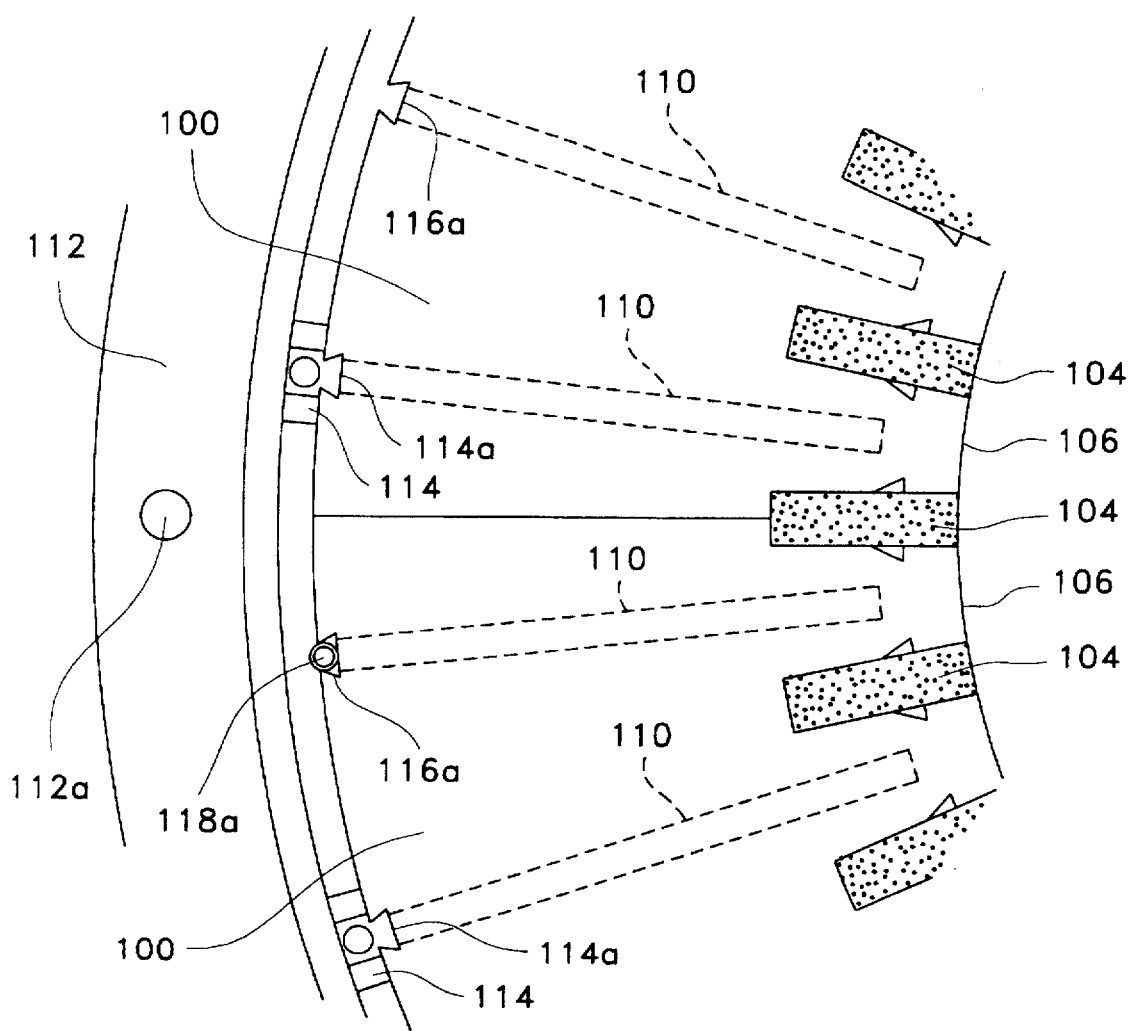
FIG. 10 is an expanded view of a portion of the probe array shown in FIG. 9.

Referring now to FIGS. 9 and 10, there are shown cross-section views of stator core punching assembly 100. FIGS. 9 and 10 illustrate how an array of optical probes 118a are preferably positioned around an electrical generator to fully monitor the generator for optical emissions including corona ionizations.

Figure 11:
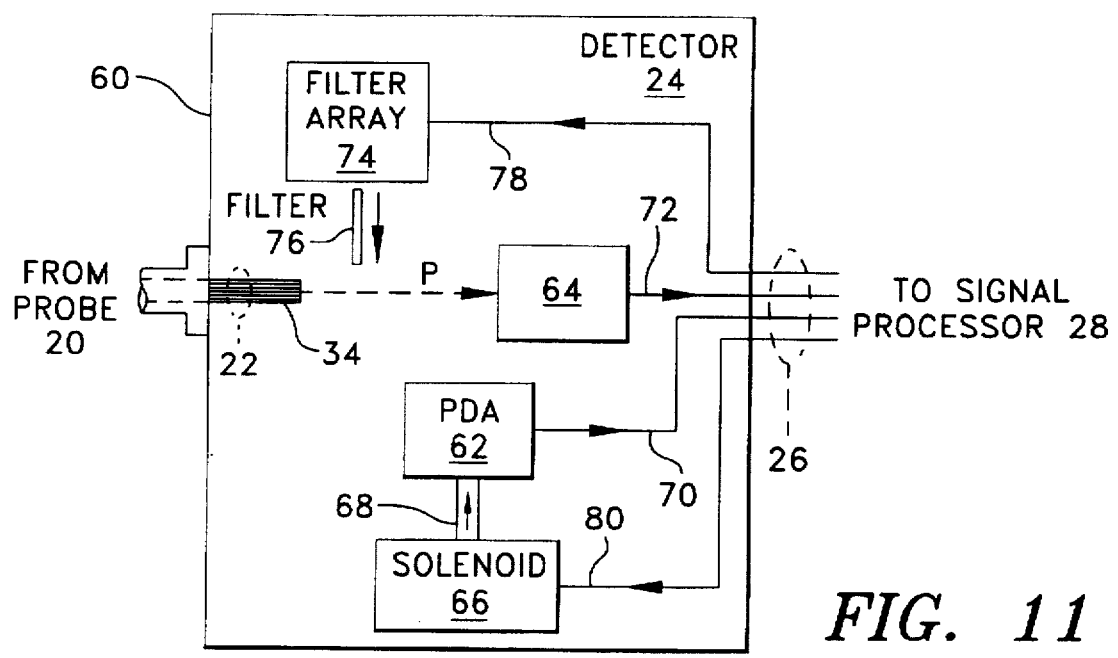
FIG. 11 is a schematic diagram of a preferred detector assembly for converting, light acquired by optical acquisition devices of an optical probe to electrical signals in accordance with a preferred embodiment of the present invention.

Referring now to FIG. 11, there is shown a schematic diagram of a preferred detector assembly 24 for converting optical radiation acquired by optical acquisition devices 34 of an optical probe 20 to electrical signals in accordance with a preferred embodiment of the present invention. As shown in FIG. 11, a group or bundle 22 of fibers 34 from one or more probes 20 is brought through a wall of a detector housing 60 and terminated within the housing. The detector housing 60 is opaque to all photons that are detectable by the photoelectric converter(s) within it, e.g. ultraviolet and visible, in order to prevent detection of stray photons from other sources. Enclosed in the housing 60 is at least one position-sensitive photoelectric converter 64 which is disposed so as to receive light emitted from the terminal ends of optical fibers 34 and to generate an electrical signal responsive to the received light. The terminal ends of fibers 34 in housing 60 may be flat surfaces, but in order to modify or control the path of the emitted light they may be terminated with curved surfaces or provided with auxiliary optics.

The photoelectric converter 64 is position-sensitive in that it provides distinguishable output signals depending on the location on the converter at which it receives light. Accordingly, by directing the light emitted from different fibers 34 to different locations on the converter 64, signals are produced which include position information relating to the particular location within the generator from which the detected light was emitted. Thus, photoelectric converter 64 has a photocathode surface which is divided into a plurality of different sensing areas. As photons strike the photocathode surface, a separate output signal is generated by the photoelectric converter for each of the different sensing areas. Each such output signal represents the intensity of photons striking one of the different sensing areas on the photocathode surface. Thus, photoelectric converter 64 is considered to be "position-sensitive" because it identifies not only the intensity of photons striking the photocathode surface, but also the position (or area) on the photocathode surface where the photon intensity was received.

The position information provided by photoelectric converter 64 is important to the overall invention. As explained more fully in the specification, in the present invention light is acquired separately from a plurality of different areas (on a piece of electrical equipment being monitored) by corresponding optical acquisition devices 34 (e.g., fiber optical strands). Each optical acquisition device 34 receives light from a field of view corresponding to a different one of the different areas on the electrical equipment being monitored. At converter 64, the ends of optical acquisition devices 34 representing sever al field s of view are grouped together and light from each of the grouped devices is simultaneously aimed at the photocathode surface of the converter 64. Based upon where photons from the optical devices 34 strike the photocathode ode surface of the detector 64, a determination is made as to which of the optical acquisition devices 34 provided the photons to the detector 64 and the area on the equipment being monitored (or field of view) from which the photons were emitted.

Desirably, the photoelectric converter 64 would have a spectral response and a dynamic range which would permit it to respond to light of the entire amplitude and wavelength range which may occur in a generator under corona, arcing, flame ignition combustion, and smoldering conditions. In practice, because of the limitations of existing photoelectric converters, a plurality of different converter types is used. In accordance with a further aspect of the invention, the detector 24 includes a converter 64 of a first type with first photoelectric response characteristics, and means 66 for causing the light emitted from the optical fibers 34 to be selectively supplied to each converter. In a particularly preferred embodiment, the invention includes means for selectively supplying the light emitted by the optical fibers 34 to either the first or the second converter in accordance with predetermined characteristics of the light. Accordinly, the first converter 64 is preferably a position-sensitive photomultiplier tube, which is sensitive to low light levels such as may occur in corona conditions but is saturated and may be damaged by moderate light intensities. The preferred second converter 62 is a photodiode array, which lacks the sensitivity of a photomultiplier but is responsive to higher light intensities which may occur in arcing conditions and can withstand intense illumination without damage. The presently preferred means 66 for selectively supplying light to the converters upon predetermined conditions is a mechanical means for redirecting the light from one converter to the other in accordance with the light intensity as reflected in the electrical output signal of the active converter.

The present invention further includes means for determining the spectral characteristics of the light received by detector 24. While spectral information might be derived in detector 24 by directing the received light to a spectrometer, in the preferred embodiment as described herein the detector 24 includes optical filters having known spectral response characteristics which are interposed in the light path between fibers 34 and converters 62 and 64, and the electrical signals from the converters are processed by the signal processor 28 to derive the spectral characteristics of the received light. Use of a spectrometer as the spectral characteristic determining means has certain advantages, including speed of obtaining spectral information. However, it is believed that use of optical filters as the spectral characteristic determining means will generally be preferable because of the greater mechanical simplicity in interposing filters in the light path compared with directing the received light to a spectrometer.

Referring still to FIG. 11, the detector housing 60 encloses the detector components which preferably include a photodiode array (PDA) 62, a position sensitive photomultiplier (PMT) 64, and solenoid 66 with a movable shaft 68 coupled to the photodiode array 62. Photomultiplier 64 is mounted so as to receive along an optical path P the light which is emitted by the fibers 34 in bundle 22. While in a normal operating mode, as shown, the photodiode array 62 is in a neutral position not blocking the path P between the fibers and the photomultiplier 64, and light emanating from the fibers impinges on the photosensitive surface of photomultiplier 64 where its intensity and position are detected. To optimize the number of fibers in the group which can be handled by the detector, the distance along path P between the fiber termination point and the photocathode of the photomultiplier 64 should be minimized so that the light emanating from a fiber does not diverge over the path P sufficiently to illuminate multiple sensing areas. However, for this arrangement of the invention it is necessary to allow clearance for the insertion of the photodiode array 62 as well as for optical filters as described below. Depending on the spacing of the elements of the photocathode of photomultiplier 64 and the diameter of the fibers 34, the fibers may require separation to align them with the photocathode elements, and a means such as a perforated sheet for holding the fiber terminal ends at the required spacing may be provided in detector 24. It is believed that photomultipliers manufactured by Hammamatsu, Model No. R3292-06, and by Quantar Technologies, Inc., Model No. 2601A, are suitable for use as photomultiplier 64.

The present invention includes means for monitoring the output signal level of photomultiplier 64 to control substitution of the photodiode array 62 as the active converter. Such means may be a dedicated circuit located in detector housing 60, or more preferably in signal processor 28. When it is determined by the monitoring means that the output of photomultiplier 64 exceeds a predetermined threshold, which may be set near its maximum output voltage and current, a signal is transmitted to solenoid 66 over solenoid control line 80 to actuate the solenoid. Actuation of solenoid 66 cause the solenoid shaft 68 and attached photodiode array 62 to be moved in the direction indicated by the arrow so that photodiode array 62 to be moved in the direction indicated by the arrow so that photodiode array 62 is inserted in path P between the terminal ends of fibers 34 and the photomultiplier 64, with the photosensitive surface of photo.diode array 62 disposed to receive the light emanating from the fibers 34. This effects substitution of photodiode array 62 for photomultiplier 64 as the active photoelectric converter in the detector, and protects the photomultiplier from overexposure by occluding it. In a similar fashion, the output of the photodiode array 62 may be monitored when it is active, so that when its output falls below a predetermined threshold, a signal on control line 80 to solenoid 66 causes the photodiode array 62 to be withdrawn from the path P to allow photomultiplier 64 to become the active converter.

Other arrangements may be used to effect substitution of converters. One such arrangement is to provide two solenoids, one attached to the photodiode array 62 and the other attached to the photomultiplier 64. When it is active, the photomultiplier 64 is disposed closely adjacent to the ends of the fibers 34. When it is necessary or appropriate to use the photodiode array 62, by actuation of the solenoids, the photomultiplier 64 is moved away from the fiber bundle, allowing the photodiode array to be moved into the light-receiving position. This arrangement may cause damage to the photomultiplier due to the fast movement of the solenoid. Another alternative arrangement is to provide a solenoid attached to the fiber bundle. In this arrangement, the fiber bundle moves from the photomultiplier allowing the photodiode array to move into position by actuation of the solenoids. It is necessary in this arrangement to allow the fiber bundle to bend slightly but sufficiently to allow space for insertion of the photodiode array into the light path. In another alternative, the photomultiplier and the photodiode array and be maintained at fixed positions, with the fiber bundle 22 being moved to direct light to either one or the other. However, in some situations the selected fibers may not be sufficiently flexible to permit the necessary movement. The foregoing alternative arrangements have the advantage of minimizing the length of the path P since they do not require a fixed gap between the fiber ends and the multiplier to allow for insertion of the photodiode array. However, they have the disadvantage of increased mechanical complexity.

Also enclosed within detector housing 60 is an optical means for selectively interposing an optical filter(s) in the optical path P between the fiber bundle 22 and the active photoelectric converter. The preferred means shown in FIG. 10 includes a filter array 74 which contains a plurality of filters 76, each with known optical characteristics, which may be selectively interposed in the optical path P. As described below, this enables determination of the spectral characteristics of the received light. A signal on filter array control line 78 causes a selected one of the filters 76 to be moved from its inactive or storage position in the filter array 74 into the path P, as indicated by the arrow adjacent the illustrated filter 76. When photoelectric conversion and signal processing using the selected filter have been completed, a signal on control line 78 returns the selected filter to its storage position in array 74, to enable the desired spectral analysis to be performed. It is believed that a carousel slide projector mechanism may be enlarged for use as the filter means, with a plurality of filters 76 stored in the carousel in place of photographic slides.

Figure 12:
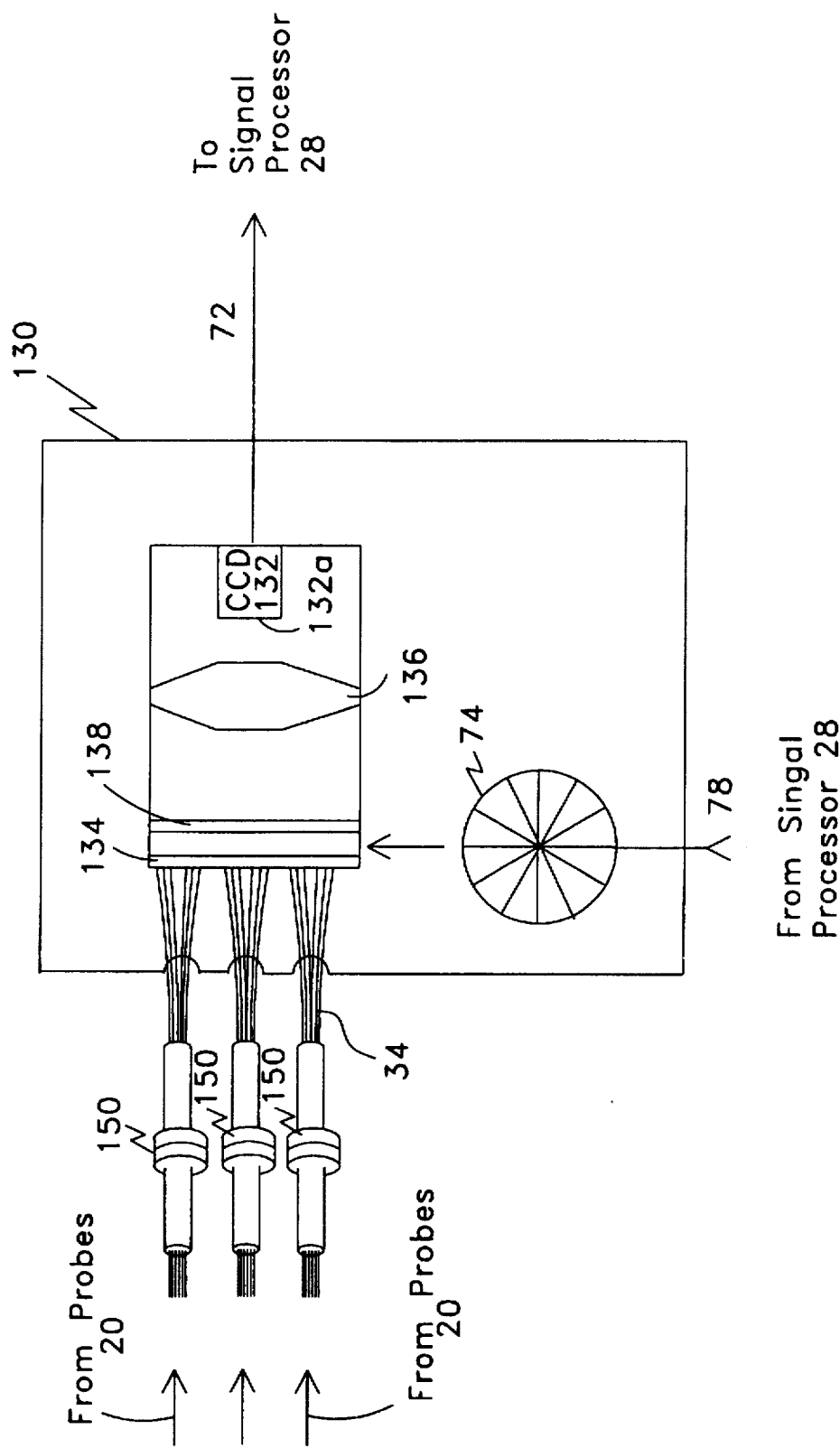
FIG. 12 is a schematic diagram of an alternative preferred detector assembly for converting light acquired by optical acquisition devices of an optical probe to electrical signals in accordance with an alternative preferred embodiment of the present invention.

Referring now to FIG. 12, there is shown a schematic diagram of an alternative preferred detector assembly 130 for converting light acquired by optical acquisition devices 34 of probe(s) 20 to electrical signals in accordance with an alternative preferred embodiment of the present invention. Detector 130 functions similarly to detector 24, with the exception of the following differences noted below. A single CCD array 132 is used in detector 130 as the position-sensitive photoelectric converter (as opposed to the photomultiplier tube 64 and photodiode array used in detector 24). In the preferred embodiment of detector 130, CCD 132 has a dynamic range which would permit it to respond to light of the entire amplitude and wavelength range which may occur in a generator under corona, arcing, flame ignition combustion and smoldering conditions. The InstaSpec® IV CCD array manufactured by Oriel is suitable for use as CCD 132. CCD 132 is mounted inside detector 130 opposite a perforated tube sheet 134 which is used to align the termination ends 40 (not shown) of fibers 34 into a square grid as the fibers enter detector 130. Due to the small size of the face 132a of CCD 132 as compared to the size of tube sheet 134, it is necessary to reduce the composite image of the tube sheet 134 so that it will fit on face 132a. This is accomplished by using a converging lens assembly 136 in between tube sheet 134 and face 132a. As with detector 24, a plurality of filters (from a carousel 74) may be selectively interposed in the optical path between the fibers 34 and CCD 132. In detector 130, a filter slot 138 is provided for holding an individual selected filter 76 from carousel 74 during use of the selected filter by detector 130.

Figure 13:
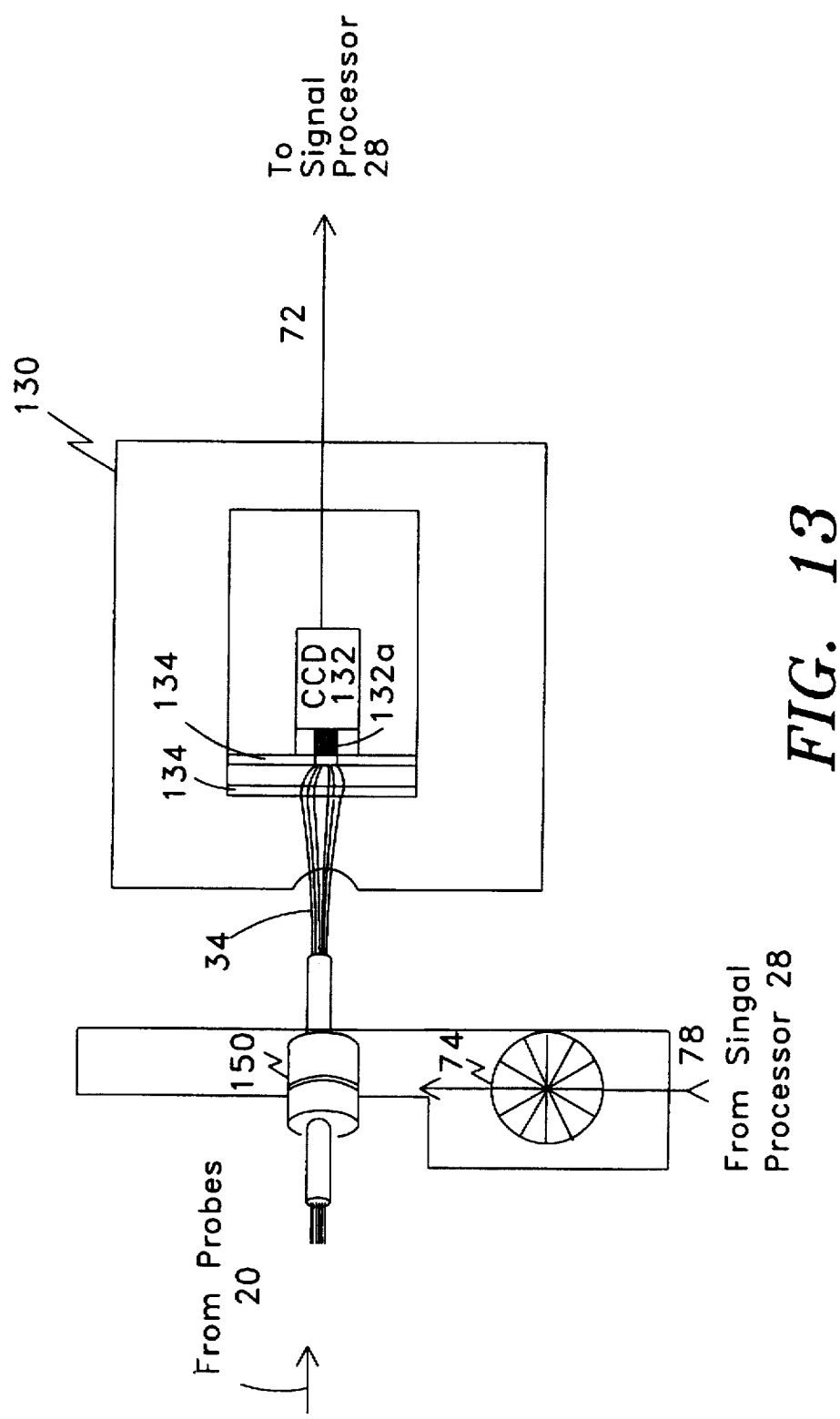
FIG. 13 is a schematic diagram showing an alternative detector assembly arrangement wherein all optical signals coming into the detector assembly pass through a single optical switch, in accordance with an alternative preferred embodiment of the present invention.
Figure 15:
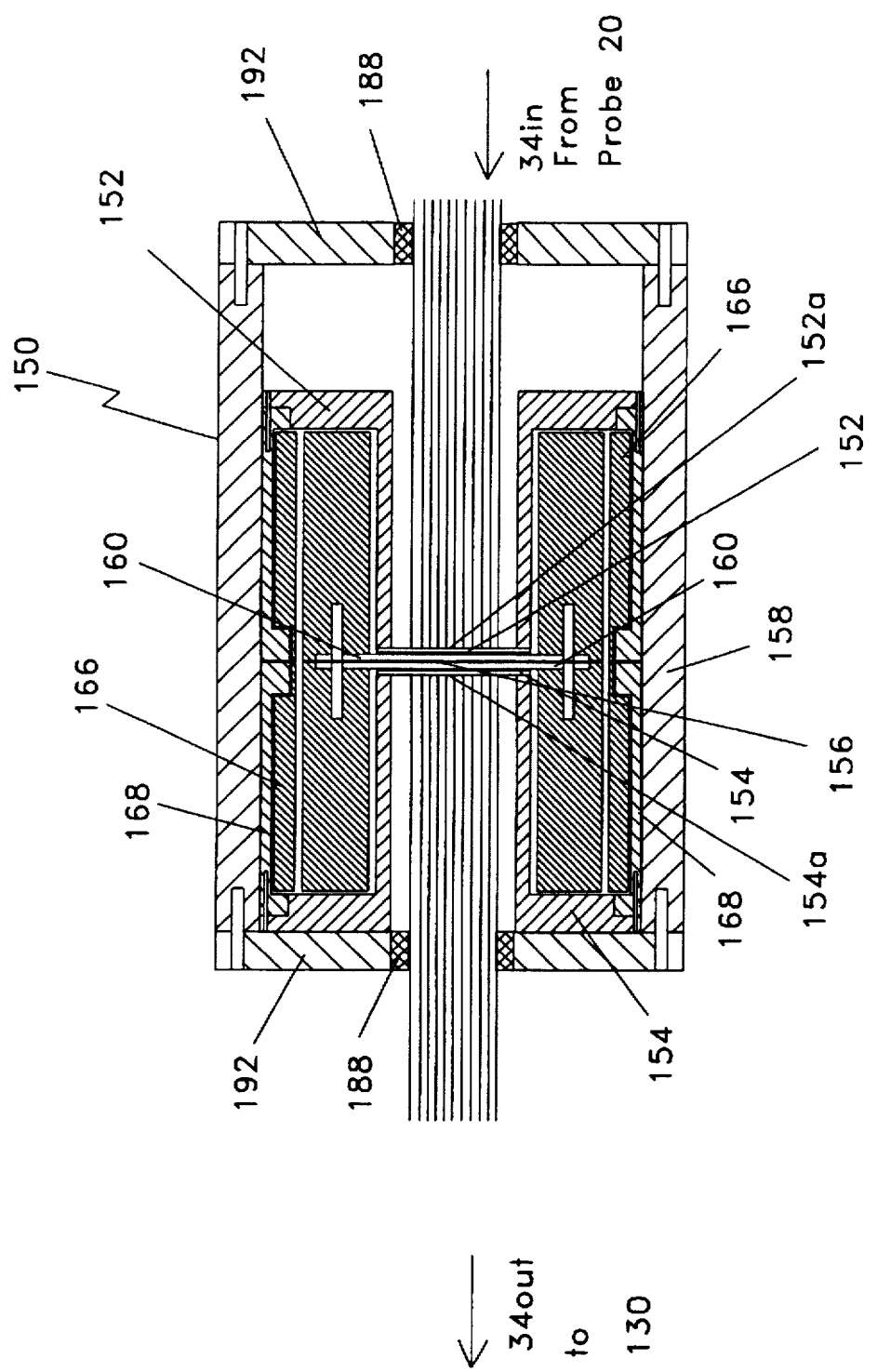
FIG. 15 is a cross-sectional view of an optical switch for selectively blocking optical signals acquired by an optical probe from entering the detector assembly of FIG. 12 in accordance with a preferred embodiment of the present invention.
Figure 16:
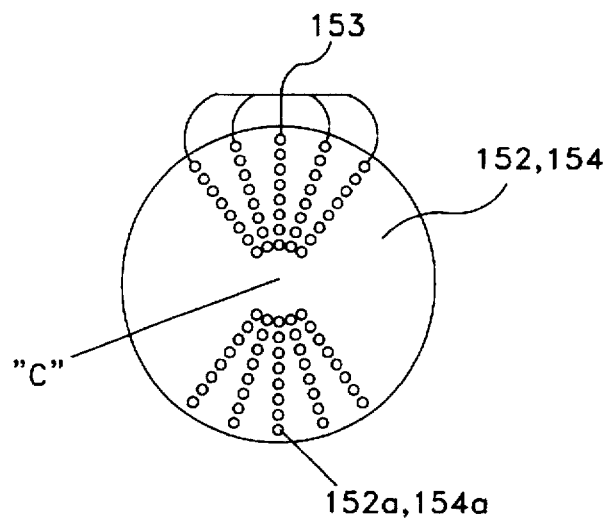
FIG. 16 is a front view of a fiber termination port used for coupling optical fibers to the optical switch of FIG. 15, in accordance with a preferred embodiment of the present invention.
Figure 17:
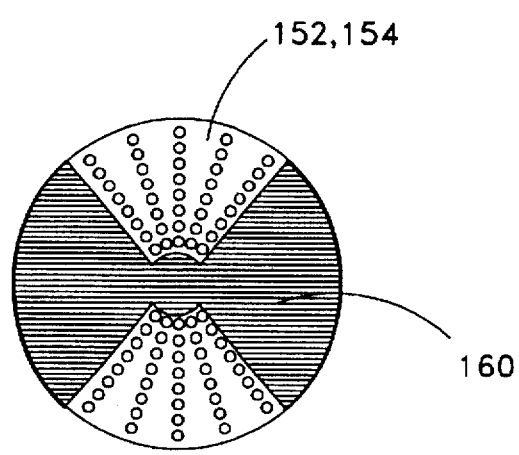
FIG. 17 is a cross-sectional view of the optical switch of FIG. 15 showing the optical switch in its open position.
Figure 18:
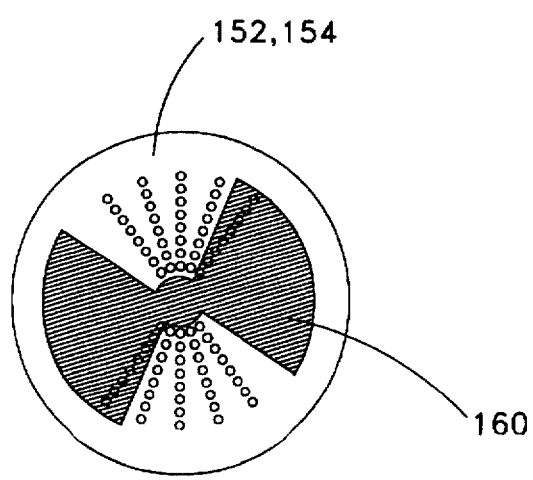
FIG. 18 is a cross-sectional view of the optical switch of FIG. 15 showing the optical switch in a partially-closed position.
Figure 19:
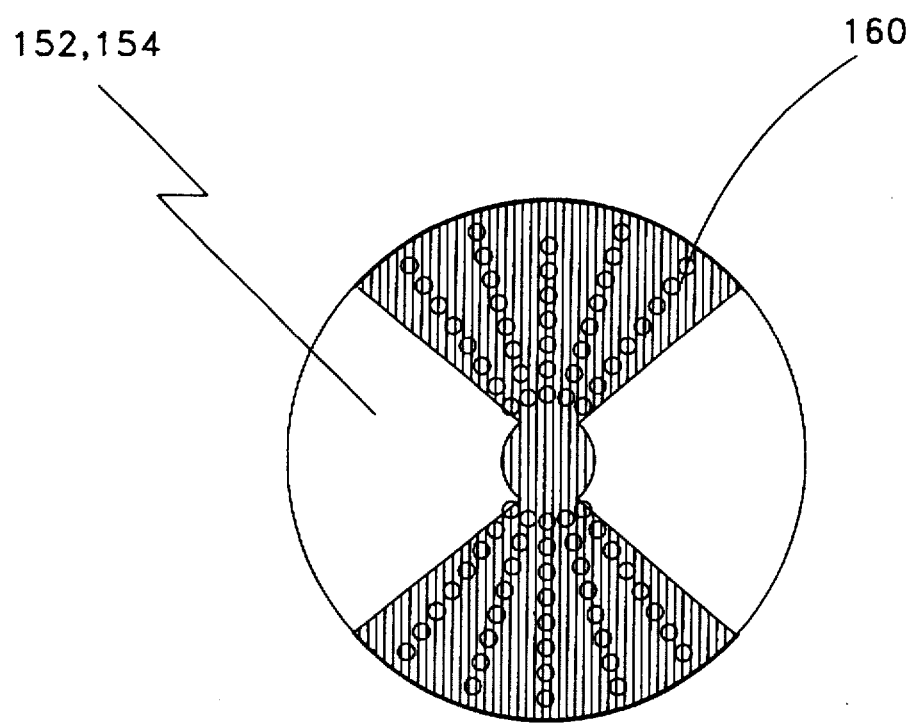
FIG. 19 is a cross-sectional view of the optical switch of FIG. 15 showing the optical switch in its fully-closed position.
Figure 20:
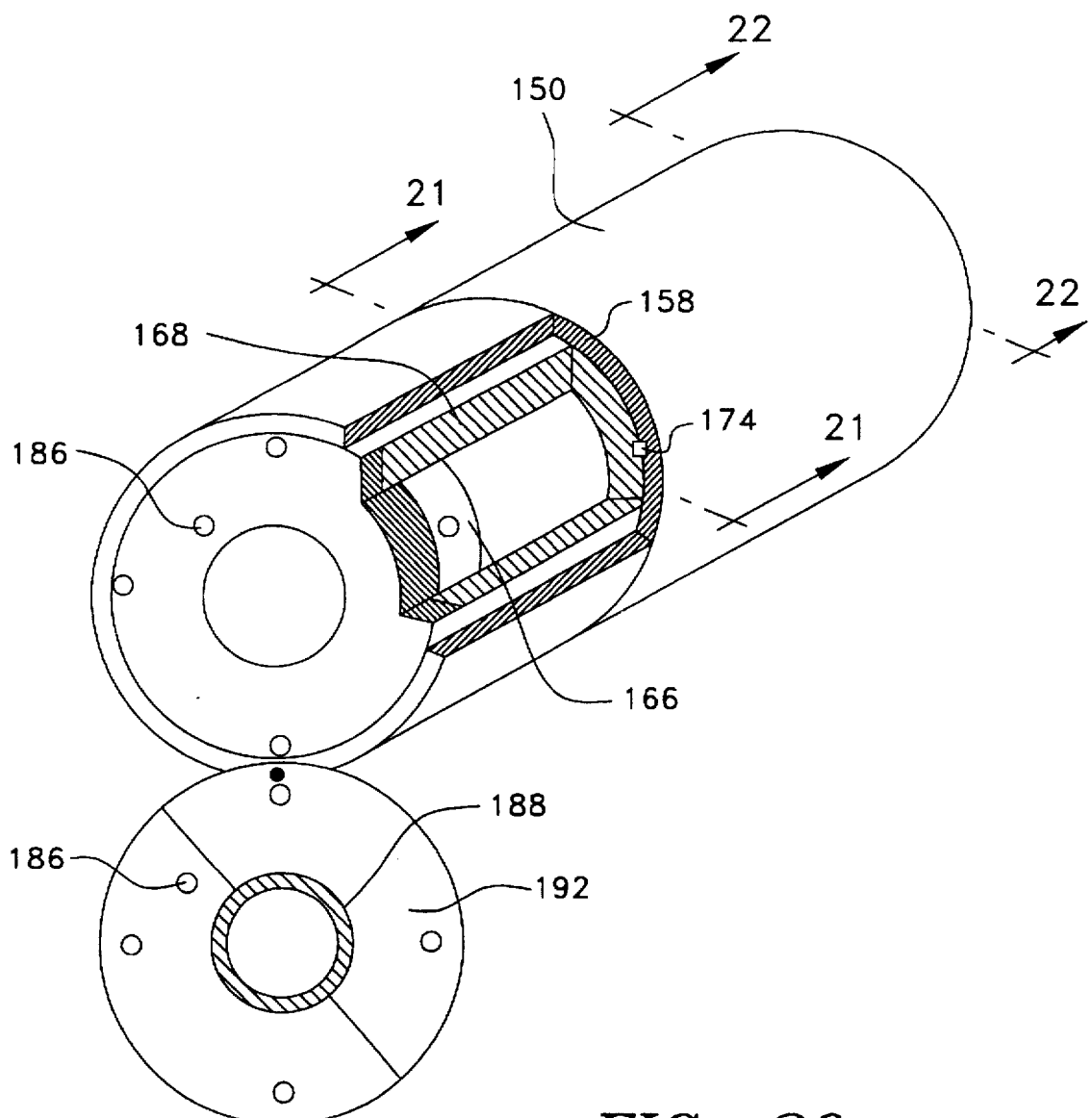
FIG. 20 is a cut-away isometric view of the optical switch of FIG. 15.
Figure 21:
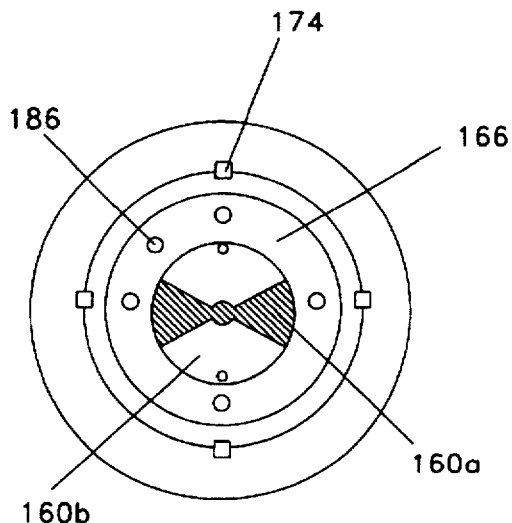
FIG. 21 is a cross-sectional view of the optical switch of FIG. 20 illustrating the positioning of a movable light blocking structure within the optical switch.
Figure 22:
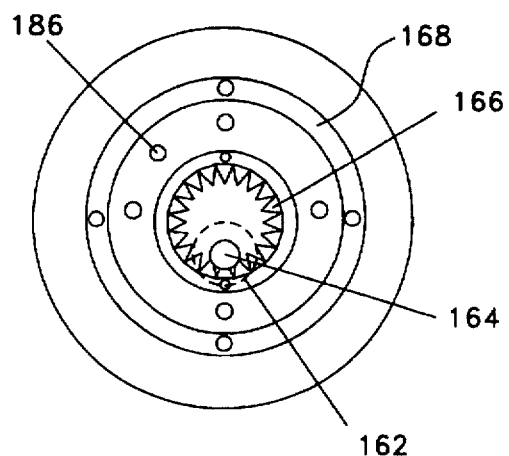
FIG. 22 is a further cross-sectional view of the optical switch of FIG. 20 illustrating the positioning of the gear drive mechanism used for rotating the movable light blocking structure within the optical switch.
Figure 23:
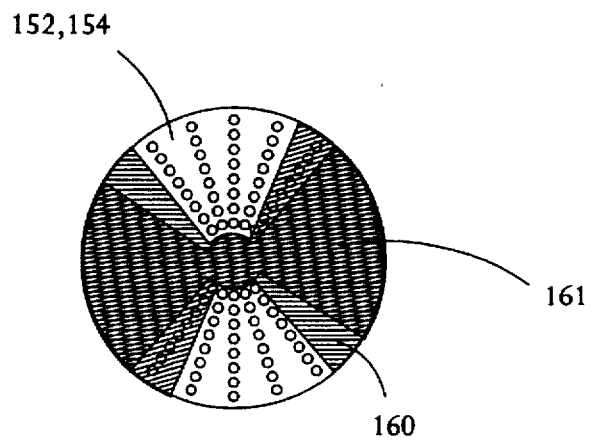
FIG. 23 is a cross-sectional view of an alternative optical switch having two angularly offset movable light blocking structures which are used in combination for isolating one or more rows of optical fibers, in accordance with an alternative preferred embodiment of the present invention.

Referring now to FIG. 13, there is shown a schematic diagram of a further detector assembly arrangement, in accordance with a still further alternative embodiment of the present invention. The system of FIG. 13 is the same as that shown in FIG. 12, except that in FIG. 13 all the optical signals which are fed to the detector assembly 130 are passed through a single optical switch 150. In addition, in the embodiment of FIG. 13, the optical switch 150 includes a slot for selectively receiving the optical filters from carousel 74. This slot is preferably positioned with the interior region 156 of the switch, described hereafter in connection with FIG. 15. Thus, in the embodiment of FIG. 13, the optical filtering means and lens 136 from FIG. 12 have been removed from the detector assembly 130, and the filtering means has been relocated inside of the optical switch 150.

Figure 14:
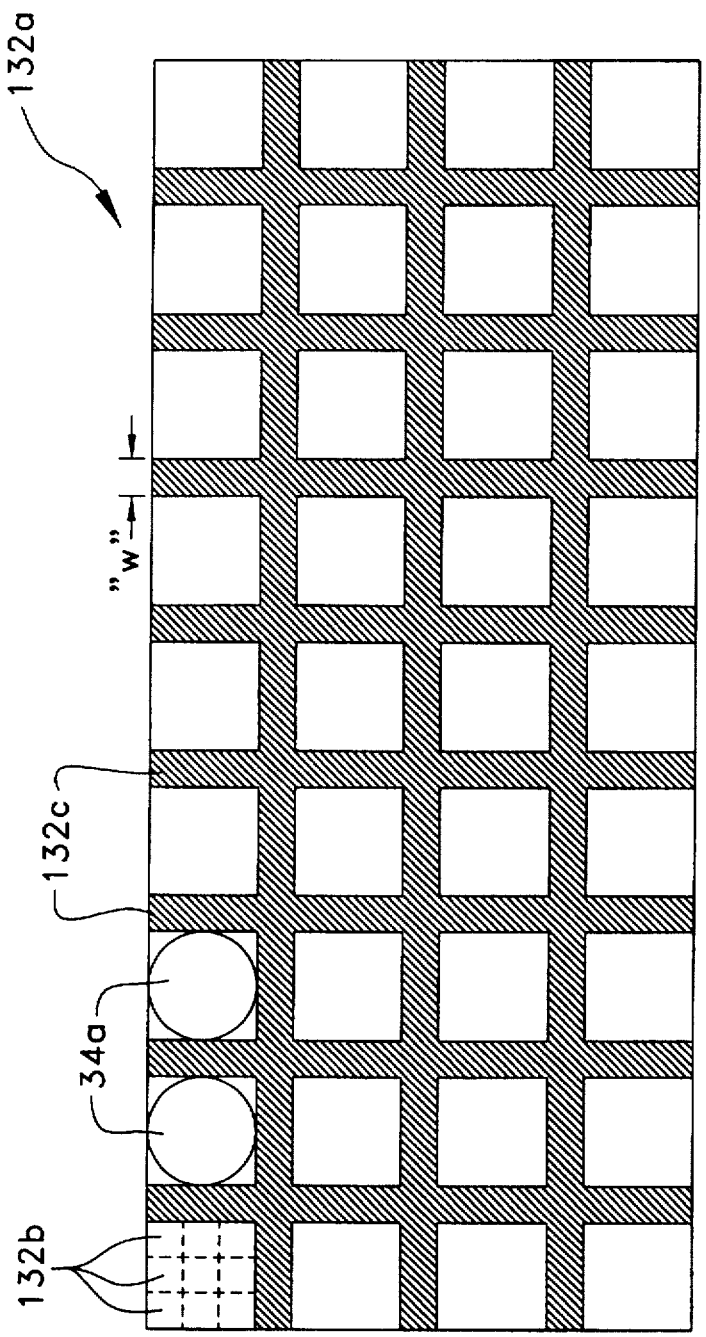
FIG. 14 is a front view of a preferred pixel masking layout for isolating on separate areas of a CCD array different optical signals transmitted from the optical fiber termination ends entering the detector assembly of FIG. 12.

Referring now to FIG. 14, there is shown a front view of a preferred pixel masking layout for isolating on separate areas of CCD face 132a different optical signals from the fibers 34 entering detector 130. CCD face 132a is formed from a two-dimensional array of individual picture elements (pixels) 132b. In the preferred embodiment of detector 130, resolution is improved by allowing the "spot size" 34a generated by each optical fiber 34 on face 132a to cover more than one pixel 132b. The pixels corresponding to each spot 34a are then added (by signal processor 28) to obtain a signal representing the optical emissions from each associated fiber 34. In the preferred embodiment, a mask or border 132c is used to isolate the pixels corresponding to each fiber 34, and to prevent overlap of optical signals from multiple fibers 34 from occurring on face 132a. Thus, signal processor 28 preferably includes means for identifying or storing the position of each pixel falling within the border or mask 132c. Signal processor 28 then effectively zeros (or ignores) any amplitudes of pixels falling within mask 132c when summing the pixel values corresponding to each fiber 34. The width "w" of the border or mask 132c may be one or more pixels.

Referring now to FIGS. 15–23, there are shown various views of an optical switch 150 for selectively blocking optical signals acquired by fibers 34 associated with an optical probe 20 from entering detector assembly 130. Optical switch 150 may be used, for example, to isolate the outputs of various probes 20 coupled to detector 130. Optical switch 150 is formed of an input fiber termination port 152 for coupling a plurality of fiber end portions 152a of input fibers $34_{IN}$ to the input of switch 150. Input fibers $34_{IN}$ enter switch 150 through an optical seal 188. Optical seal 188 may be formed of rubber, and functions to prevent stray light from entering into the interior of switch 150. An output fiber termination port 154 is provided for coupling a corresponding plurality of end portions 154a of output fibers $34_{OUT}$ to the output of switch 150. As shown in more detail in FIG. 16, each of the fiber termination ports 152 and 154 are formed of a plurality of rows 153 of openings for receiving fiber end portions. Each row 153 is aligned radially with respect to the center "c" of each of the ports 152 and 154. The fiber termination ports 152 and 654 sit inside gear assemblies 168 which are secured by mounting slots 174 to the interior walls of switch 150. Each input fiber end portion 152a is preferably aligned optically across the interior region 156 of switch 150 with a corresponding output fiber end portion 154a. Interior region 156 thus represents an optical transition path region between ends 152a and 154a. Interior region 156 is bounded on one end by input fiber termination port 152, on a second end by output fiber termination port 154, and by an opaque outer enclosure 158. When there is nothing obstructing transmission, optical signals flow freely from ends 152a, through interior region 156, and to ends 154a. Optical switch 150 is completely enclosed (and thereby optically isolated) by the opaque outer enclosure 158 and end caps 192.

Referring still to FIGS. 15–23, two movable light blocking structures 160 formed from opaque regions 160a and transparent regions 160b are affixed to gear assemblies 168 within optical switch 150. Movable light blocking structures 160 may be rotated about axis "x" (shown in FIG. 20) in order to selectively block optical signals from passing between ends 152a and 154a. In the preferred embodiment depicted by FIGS. 15–22, the movable light blocking structures 160 are angularly aligned with and mechanically coupled to each other. The movable light blocking structures 160 have an open position (shown in FIG. 17) wherein no optical signals passing from ends 152a to ends 154a are blocked by opaque regions 160a. By rotating the movable light blocking structures ¼ turn, the structures 160 are transformed to a fully-closed position (shown in FIG. 19). When structures 160 are in a fully-closed position, opaque regions 160a block all optical signals from passing between ends 152a and 154a. Movable light blocking structures 160 can also be rotated to a partially-closed position (shown in FIG. 18), wherein a portion of the optical signals from ends 152a pass through regions 160b to corresponding ends 154, and the remaining optical signals from ends 152a are blocked by opaque regions 160a. In a preferred embodiment of optical switch 150 (shown in FIGS. 15–22), an electromechanical actuator 162 (e.g., a stepper motor) may be used to drive the movable structures 160 between their open and closed positions. Electro-mechanical actuator 162 is preferably coupled to a turning gear 164 in a planetary gear arrangement 166 in order to rotate the structures 160 about the "x" axis in a step-wise manner, wherein the angular distance between steps corresponds to the angular distance between adjacent rows 153. The planetary gear arrangement 166 is placed in a gear assembly 168 in the interior wall of the optical switch 150. In order to maintain and rotate both light blocking structures in optical alignment with each other, an alignment pin 186 is used for coupling both structures 160 together. In an alternative embodiment shown in FIG. 23, two angularly offset light blocking structures 160 and 161 may be rotated independently within optical switch 150. This alternative embodiment is useful for optically isolating one or more rows 153 which could not otherwise be optically isolated using blocking structures which are always angularly aligned with each other.

Figure 24:
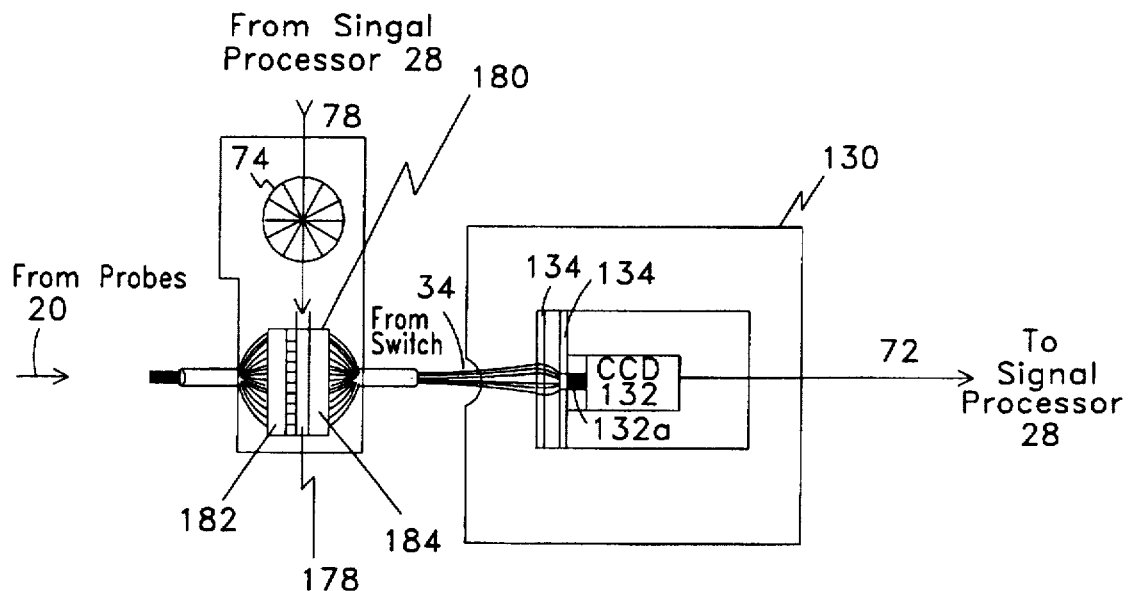
FIG. 24 is a schematic diagram showing a further alternative detector assembly arrangement wherein all optical signals coming into the detector assembly pass through an alternative optical switch, in accordance with a further alternative embodiment of the present invention.
Figure 25:
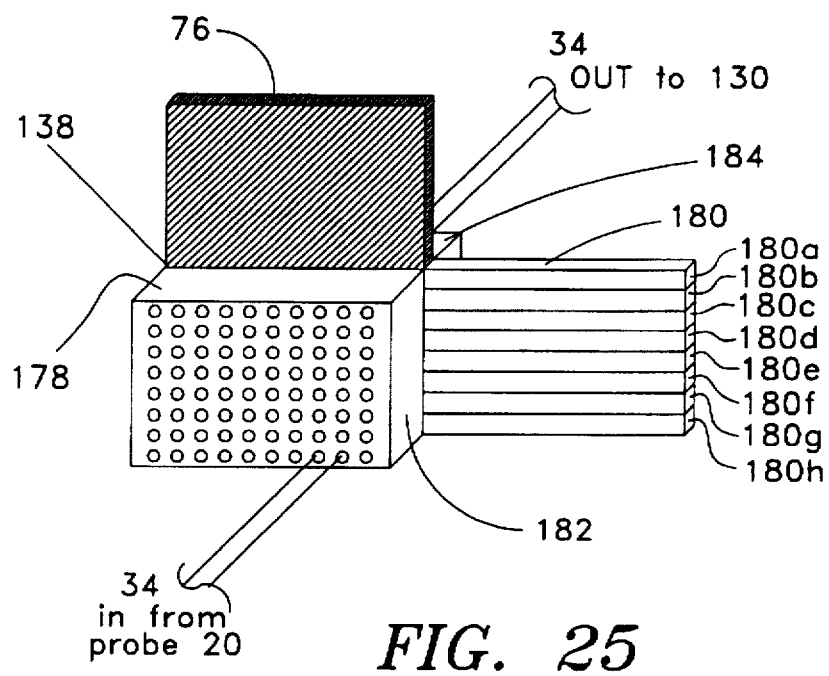
FIG. 25 is an isometric view of a further optical switch structure for selectively blocking, optical, fibers, in accordance with a still further alternative embodiment of the present invention.
Figure 26:
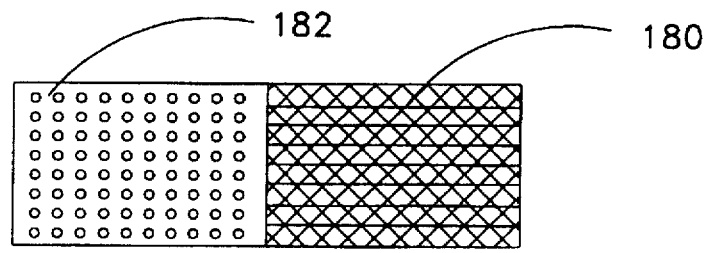
FIG. 26 illustrates the optical switch structure of FIG. 25 in its fully-open position.

Referring now to FIG. 24, there is shown a schematic diagram of a further detector assembly arrangement, in accordance with a still further alternative embodiment of the present invention. The system of FIG. 24 is the same as that of FIG. 13, except an alternative optical switch 178 is used in the system of FIG. 23 in place of optical switch 150.

Figure 27:
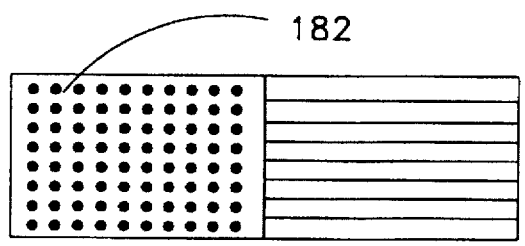
FIG. 27 illustrates the optical switch structure of FIG. 25 in its fully-closed position.
Figure 28:
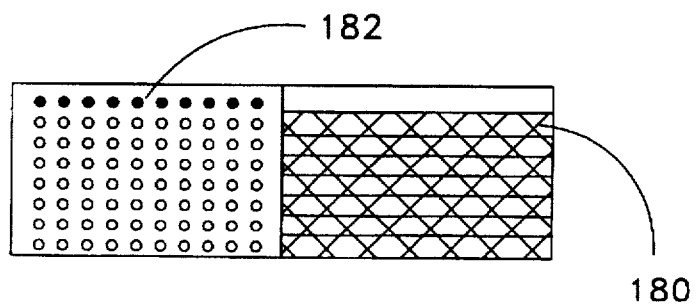
FIGS. 28 and 29 illustrate the optical switch structure of FIG. 25 in different partially-closed positions.
Figure 29:
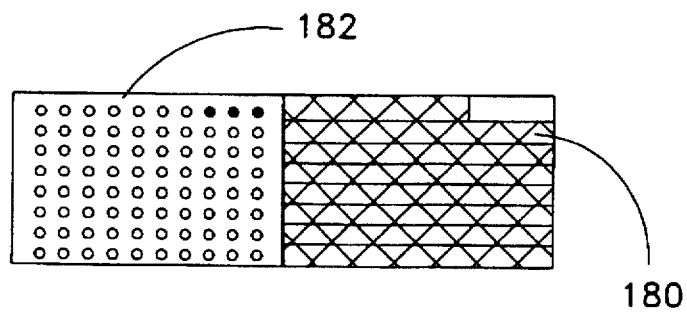

Referring to FIGS. 25–29, there are shown various views of an alternate optical switch assembly 178 for selectively blocking optical signals. A movable light blocking structure 180 formed of opaque regions 180a–180h is disposed between input and output rectangular fiber plates 182 and 184 of switch 178. Fiber plates 182 and 184 are each formed of openings (for receiving fiber ends). The openings are aligned along a plurality of perpendicular rows and columns. Each region 180a–180h of light blocking structure 180 may be independently slid between plates 182 and 184. Movable light blocking structure has an open position (shown in FIGS. 25 and 26) where no optical signals passing from $34_{IN}$ to $34_{OUT}$ are blocked by opaque regions 180a–180h. By inserting a singular or multiple movable light blocking structures 180a–180h between plates 182 and 184, the structure 180 is partially closed as shown in FIGS. 28 and 29. As shown in FIG. 27, by inserting all light blocking structures 180a–180h between plates 182 and 184, the light blocking structure is completely closed. As shown in FIG. 29, the present invention may also be used to isolate individual fibers by partially inserting a single light blocking structure 180a between plates 182 and 184 so as to isolate, for example, three optical fibers.

Figure 30:
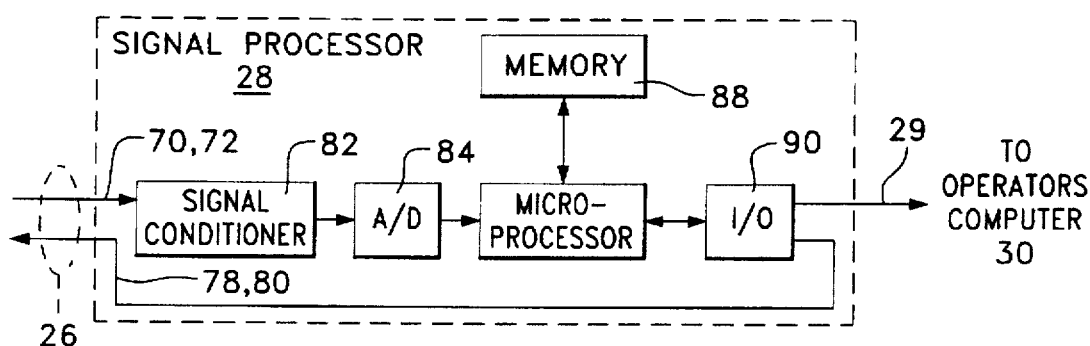
FIG. 30 is a block diagram of a signal processor for monitoring signals output by a detector and identifying the location of corona emission events occurring on a piece of electrical equipment being monitored in accordance with the preferred embodiment of the present invention.

Referring now to FIG. 30, there is shown a block diagram of a signal processor 28 for monitoring signals output by a detector and identifying the location of corona emission events occurring on an electrical generator being monitored. The output signals from a detector (either detector 24 or 130), which may be subjected to preliminary signal processing in the detector by means not shown, are conveyed to a signal processor 28 over signal lines 72 and 70 of communication channel 26. Signal processors 28 are desirably computer-based devices, and a block diagram of a suitable signal processor 28 is shown in FIG. 30. The light-responsive electrical output signals from a detector are typically initially subjected to signal conditioning, such as amplification, by a signal conditioner 82 after which the signals are digitized by an A/D converter 84 and input into microprocessor 86. It will be understood that when different converter types are used in the detector, as in the preferred embodiment described herein, signal conditioner 82 will generally require a different signal conditioning circuit for each detector type. Microprocessor 86 operates under control of a program stored in memory 88 to perform the functions described herein, and communicates with an operator's computer 30 via I/O device 90 over communication channel 29.

The amplitudes of the signals from the detector are monitored by signal processor 28 to determine the light intensity represented by the signals. When the signal amplitude is sufficient to indicate an event of interest in one or more fibers of the probes, which may be determined by comparison with a predetermined threshold value, data representing the occurrence of the event, including its nature, location, and magnitude, is transmitted to operator's computer 30. Such events may include corona, arcing, flame ignition combustion, and smoldering. The operator's computer preferably includes a visual display, and displays graphic and text information regarding the event. Data regarding all such events may be stored, either in memory 88 or in a memory contained in operator's computer 30. Data may be stored at periodic internals to record the changes in the monitored condition over time.

Signal processor 28 may control the operation of the filter array 74 to allow the system to perform spectral analysis of the light signal under predetermined conditions, such as the occurrence of an event of interest. Thus, FIG. 30 shows I/O device 90 coupled to communication channel 26 for transmission of a filter array control signal to a detector over control line 78. (In a similar manner, signal processor 28 may control the operation of the solenoid 66 by transmitting a solenoid control signal over control line 80 to effect interchange of the converters). Thus, upon occurrence of an event, data may be stored regarding the light intensity with no filter and the light intensity with each of the filters 76 selected from filter array 74. By comparison of the signal amplitudes obtained with different filters, and in view of the known transmission versus wavelength characteristics of the filters, amplitude versus wavelength information regarding the received light can be derived. This information may be used to evaluate the chemical composition of the materials involved in an event, which is useful for instance to determine the extent of damage to the monitored equipment. In order to evaluate the chemical composition of the materials involved in an event, a large number of narrow bandwidth filters may be used so that the spectrum can be determined with high resolution. However, because there are a limited number of materials which can be expected to be involved in an event, it may not be necessary to obtain a complete high resolution spectrum in order to provide the information desired in the monitoring of electrical equipment. In this environment, it is the materials typically found in the conductors, insulation, support structure, and atmosphere which are of concern. Thus, the number of filters may be minimized by providing narrow bandwidth filters selected to pass or block the spectral lines expected for materials used in these applications under the corona, smoldering, arcing, and flame ignition combustion conditions of interest. Because of their narrow bandwidth, interference filters are believed to be most preferable for spectral line identification. Such filters may be constructed with single or multiple pass or stop bands, if constructed for multiple bands, a single filter may be made to selectively filter several spectral bands occurring in events involving a particular material which is expected to be utilized in electrical equipment. For example, if copper is involved in the event it will indicate that conductive material has been exposed and maintenance is probably required. One or more filters designed to isolate spectral lines of copper under conditions of interest could determine copper involvement without necessitating a complete spectrum to be obtained and analyzed.

Figure 31:
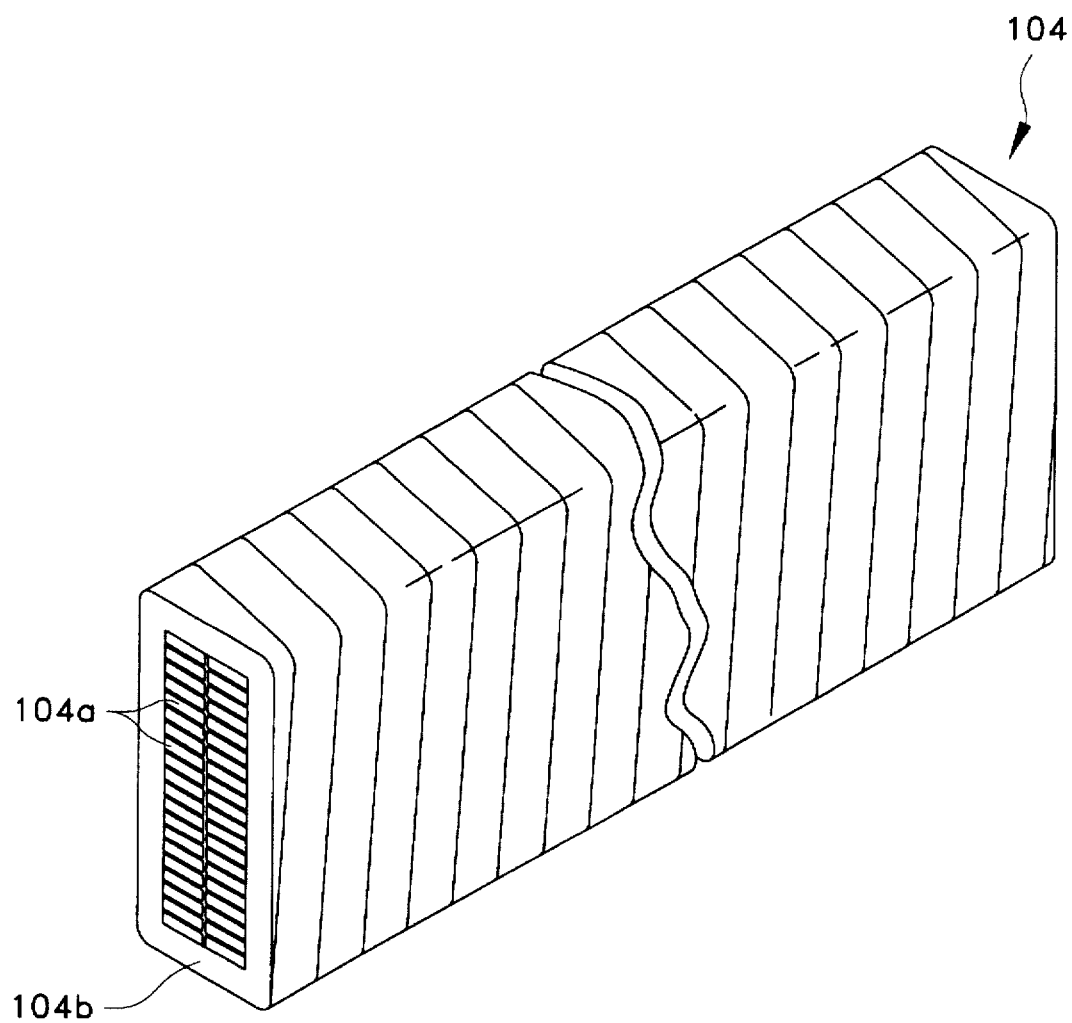
FIG. 31 is a perspective view of a portion of a generator winding surrounded by doped insulation in accordance with a preferred embodiment of the present invention.
Figure 32:
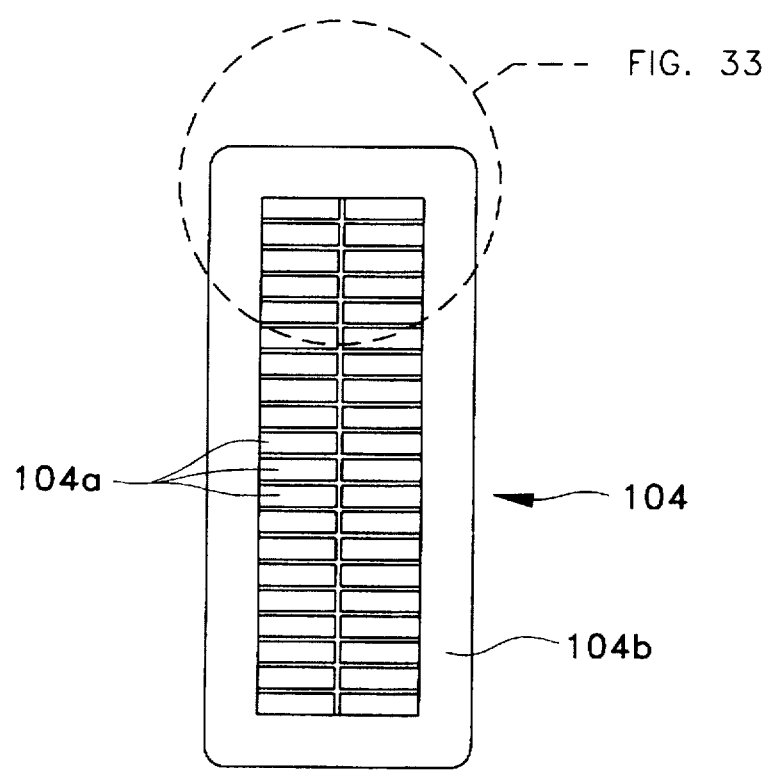
FIG. 32 is a cut-away view of the generator winding portion shown in FIG. 31.
Figure 33:
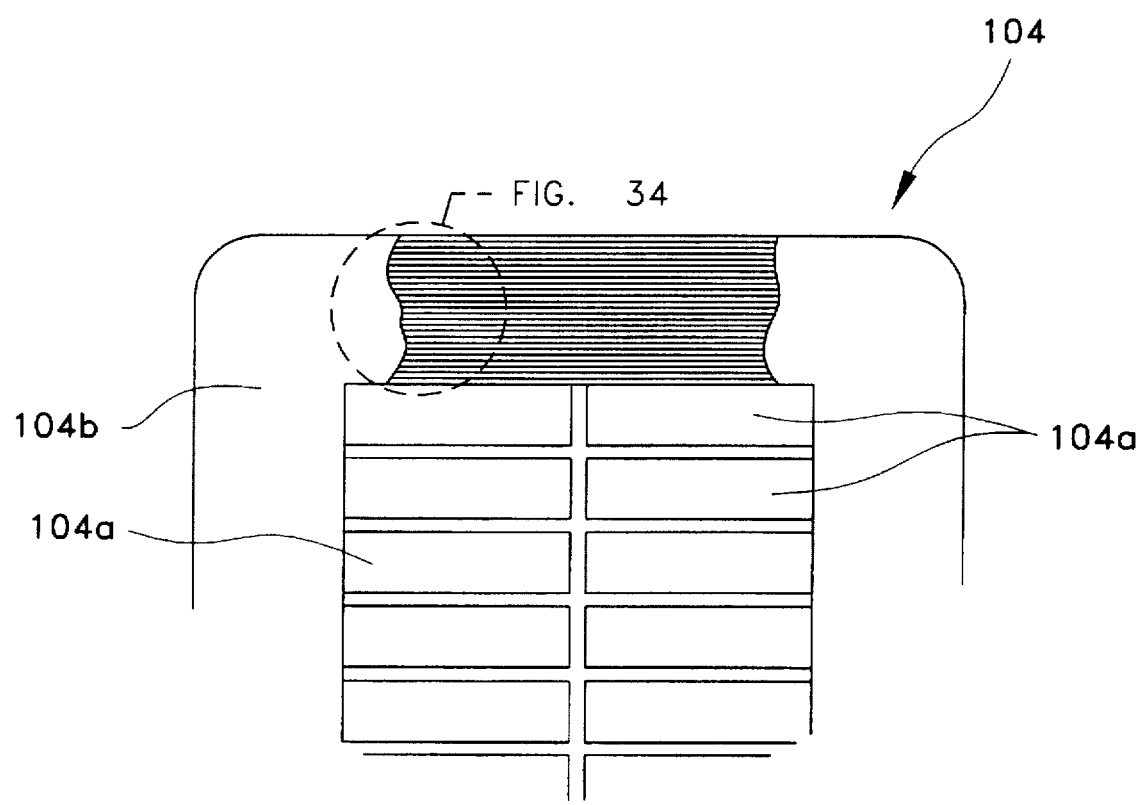
FIG. 33 is an exploded view showing sub-layers of the insulation layer illustrated in FIG. 32.
Figure 34:
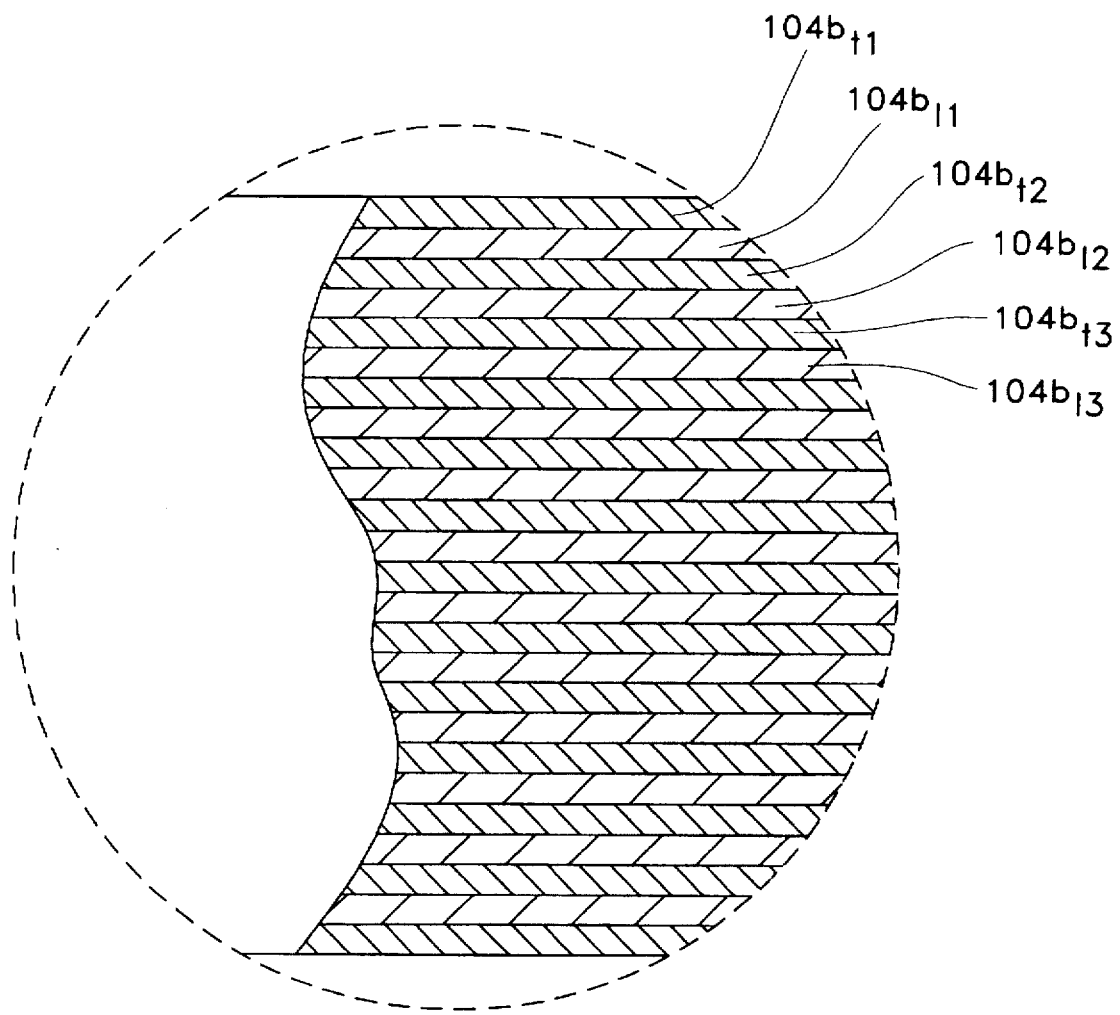
FIG. 34 is a further exploded view showing a portion of the various insulation sub-layers illustrated in FIG. 33.

In order to enhance the ability of detectors 24 and 130 to identify corona ionization emissions and the extent of insulation degradation that may have occurred around generator windings as a result of such corona ionizations, the layers of insulation surrounding a generator winding may be doped or treated with special materials that emit a distinctive optical signature upon ionization. This aspect of the present invention is shown in conjunction with FIGS. 31–34 which are discussed below. Referring now to FIGS. 31 and 32, there are shown perspective and cut-away views, respectively, of a portion of a generator winding 104. As explained more fully above, a generator winding 104 is disposed in winding slot 102 during operation of an electrical generator. Winding 104 is formed from a plurality of conductor wires 104a which run parallel to the length of winding 104. An insulation layer 104b surrounds the conductor wires 104a. In FIGS. 33 and 34, there are shown expanded views of insulation layer 104b. Thus, as shown, insulation layer 104b is formed of a series of alternating sub-layers of insulation tape ($104b_{n1}$, $104b_{n2}$, $104b_{n3}$, ...) and electrical insulation ($104b_{i1}$, $104b_{i2}$, $104b_{i3}$ ...). In accordance with the present invention, one or more of the sub-layers of insulation tape or insulation is initially doped of treated with a doping material which generates a distinctive (and predetermined) optical signature when corona ionization occurs on the sub-layer, thereby signifying its deterioration. This distinctive optical signature preferably corresponds to an isolatable narrow or specific optical wavelength which is easily detectable by the detectors and signal processing system 28 described above. The dopants or materials used to treat the sub-layers preferably should not affect the insulation qualities of the sub-layers, but should simply allow for specific optical emissions from such sub-layers upon corona ionization. Suitable dopants for treating the sub-layers in layer 104b include sodium carbonate, titanium dioxide, calcium carbonate and sodium silicate.

In accordance with a still further preferred embodiment of the present invention, each sub-layer or group of sub-layers forming insulation layer 104b may be treated with different dopants such that a series of different optical signatures will be emitted as the insulation degradation process proceeds over time. Thus, for example, sub-layers $104b_{t1}$, $104b_{i1}$ may be treated with a first dopant that emits a first predetermined optical signature upon ionization, sub-layers $104b_{t2}$, $104b_{i2}$ may be treated with a second dopant that emits a second predetermined optical signature upon ionization, and sub-layers $104b_{t3}$, $104b_{i3}$ may be treated with a third dopant that emits a third predetermined optical signature. As the deterioration of insulation layer 104b proceeds over time, different optical signatures will be emitted thereby signifying that deterioration has occurred at the sub-layers associated with such optical signatures. In the preferred embodiment, when multiple different dopants are used at various sub-layers in layer 104b, the detectors described above are used to detect the optical signatures associated with the multiple dopants, and to generate and transmit electrical signals representative of such optical signatures to signal processor 28 which then monitors such electrical signals in order to track the extent of deterioration within the various sub-layers of insulation layer 104b.

The method of spectral identification of particular insulation layers is not dependent upon the type of inner insulating tapes, outer insulating tapes, or protective coatings. The method is independent of the insulating materials. The chemical species used to dope or treat the insulation sub-layers is selected based upon certain conditions which allow for the selection of a particular element, compound, or group of compounds that are chemically compatible and desirable in an insulating system. The dopant or marker selected for use with the present invention preferably does not interact or overlap with the spectral emission lines of the insulating materials used in the insulation system. The number of markers is selected based upon the depth of the insulation region that is to be segregated, and the ability to identify chemical species that have noninterfering spectral emission lines. The dielectric strength of the insulating system must not be comprised by adding a spectral marker that violates the integrity of the non-conducting properties of the material. Markers may be suspended into the tape prior to the impregnation process in which the stator-bar tape layers are chemically treated with the polymer or other plastic insulating material. The preferred method is to introduce the spectral markers into a solvent with the monomer compounds of the material before the monomers are polymerized. This is the preferred method of adding modifiers to polymers.

Changes and modifications to fit particular operating requirements and environments will be apparent to those skilled in the art. The invention is not to be considered limited to the examples chosen for the purpose of illustration and includes all changes and modifications which do not constitute a departure from the true spirit and scope of the invention.

What is claimed is:

1. An optical switch for selectively blocking optical light signals provided from a plurality of input fiber optical strands, comprising:

(A) an input fiber termination port for coupling said plurality of input fiber optical strands to said optical switch, said input fiber termination port having a center and a plurality of rows of openings, each of said rows being aligned radially with respect to said center and having a plurality of openings for receiving ends of said input fiber optical strands;

(B) an output fiber termination port for coupling a plurality of output fiber optical strands to said optical switch;

(C) an interior optical path transmission region bounded on a first end by said input fiber termination port and on a second end by said output fiber termination port;

(D) a movable light blocking structure positioned within said interior optical path transmission region for selectively blocking said optical signals from passing between input fiber optical strands positioned along at least one of said rows of said input fiber termination port and corresponding output fiber optical strands positioned in said output fiber termination port; and (E) an electromechanical actuator for driving said movable light blocking structure in step-wise angular increments, wherein said step-wise angular increments correspond to an angular distance between adjacent ones of said rows of openings in said input fiber termination port;

wherein said movable light blocking structure is operable in a partially-closed position to fully block an optical signal from a first of said plurality of input fiber optical strands from reaching a first of said plurality of output fiber optical strands while simultaneously allowing an optical signal from a second of said plurality of input fiber optical strands to reach a second of said plurality of output fiber optical strands.

2. The optical switch of claim 1, wherein each input fiber optical strand of said plurality of input fiber optical strands is optically aligned across said interior optical path transmission region with a corresponding output fiber optical strand of said plurality of output fiber optical strands.

3. The optical switch of claim 2, said movable light blocking structure having an open and position, and a fully-closed position, wherein a plurality of optical signals flow from said plurality of input fiber optical strands across said interior optical path transmission region to said plurality of output fiber optical strands when said movable light blocking structure is in said open position.

4. The optical switch of claim 3, wherein said movable light blocking structure is operable to selectively block each and every one of said plurality of optical signals when said movable light blocking structure is in said fully-closed position.

5. The optical switch of claim 1, wherein said movable light blocking structure is positioned at a cross-section of said interior optical path transmission region and is operable to selectively block said optical signals from flowing through said cross-section.

6. The optical switch of claim 5, wherein said cross-section has a surface area, and wherein said movable light blocking structure has an opaque region that covers less than all of said surface area.

7. The optical switch of claim 6, wherein said surface area is a circle and said electro-mechanical actuator rotates said movable light blocking structure about an axis that intersects a midpoint of said circle and is perpendicular to said cross-section in order to move said movable light blocking structure between an open position and a closed position.

8. The optical switch of claim 1, wherein said interior optical path transmission region includes a filter region for positioning one of a plurality of optical filters between said input fiber termination port and said output fiber termination port.

9. A method for selectively blocking optical light signals provided from a plurality of input fiber optical strands with an optical switch, comprising the steps of:

(A) providing an input fiber termination port for coupling said plurality of input fiber optical strands to said optical switch, said input fiber termination port having a center and a plurality of rows of openings, each of said rows being aligned radially with respect to said center and having a plurality of openings for receiving ends of said input fiber optical strands;

(B) providing an output fiber termination port for coupling a plurality of output fiber optical strands to said optical switch;

(C) providing an interior optical path transmission region bounded on a first end by said input fiber termination port and on a second end by said output fiber termination Port; and (D) selectively moving, in step-wise angular increments, a movable light blocking structure positioned within said interior optical path transmission region so as to block said optical signals from passing between input fiber optical strands positioned along at least one of said rows in said input fiber termination port and corresponding output fiber optical strands positioned in said output fiber termination port;

wherein said step-wise angular increments correspond to an angular distance between adjacent ones of said rows of openings in said input fiber termination port, and said movable light blocking structure is operable in a partially-closed position to fully block an optical signal from a first of said plurality of input fiber optical strands from reaching a first of said plurality of output fiber optical strands while simultaneously allowing an optical signal from a second of said plurality of input fiber optical strands to reach a second of said plurality of output fiber optical strands.

10. The method of claim 9, wherein each input fiber optical strand of said plurality of input fiber optical strands is optically aligned across said interior optical path transmission region with a corresponding output fiber optical strand of said plurality of output fiber optical strands.

11. The method of claim 10, said movable light blocking structure having an open position, and a fully-closed position, wherein a plurality of optical signals flow from said plurality of input fiber optical strands across said interior optical path transmission region to said plurality of output fiber optical strands when said movable light blocking structure is in said open position.

12. The method of claim 11, wherein said movable light blocking structure is operable to selectively block each and every one of said plurality of optical signals when said movable light blocking structure is in said fully-closed position.

13. The method of claim 9, wherein said movable light blocking structure is positioned at a cross-section of said interior optical path transmission region and is operable to selectively block said optical signals from flowing through said cross-section.

14. The method of claim 13, wherein said cross-section has a surface area, and wherein said movable light blocking structure has an opaque region that covers less than all of said surface area.

15. The method of claim 14, wherein an electro-mechanical actuator is used in step (D) for selectively driving said movable light blocking structure between an open position and a closed position.

16. The method of claim 15, wherein said surface area is a circle, and said electro-mechanical actuator rotates said movable light blocking structure in step (D) about an axis that intersects a midpoint of said circle and is perpendicular to said cross-section in order to move said movable light blocking structure between said open position and said closed position.

17. The method of claim 9, further comprising the step of positioning one of a plurality of optical filters in said interior optical path transmission region between said input fiber termination port and said output fiber termination port.

18. An optical switch for selectively blocking optical light signals provided from a plurality of input fiber optical strands, comprising:

(A) an input fiber termination port for coupling said plurality of input fiber optical strands to said optical switch, said input fiber termination port having openings aligned along a plurality of perpendicularly aligned rows and columns, each of said rows and each of said columns having a plurality of openings for receiving ends of said input fiber optical strands;

(B) a n output fiber termination port for coupling a plurality of output fiber optical strands to said optical switch;

(C) an interior optical path transmission region bounded on a first end by said input fiber termination port and on a second end by said output fiber termination port; and (D) a plurality of independently movable light blocking structures positioned parallel to said rows, each of said movable light blocking structures being slideable within said interior optical path transmission region along an axis parallel to said rows;

wherein each of said independently movable light blocking structures functions to selectively block optical signals from passing between input fiber optical strands positioned along at least one row of said input fiber termination port and corresponding output fiber optical strands positioned in said output fiber termination port when said independently movable light blocking structure is positioned at least partially within said interior optical path transmission region.

19. The optical switch of claim 18, wherein said interior optical path transmission region includes a filter region for positioning one of a plurality of optical filters between said input fiber termination port and said output fiber termination port.

20. The optical switch of claim 18, wherein said switch is operable in a fully-open mode, a fully-closed mode, or a partially-closed mode, said switch being in a fully-closed mode when all of said independently movable light blocking structures are completely positioned within said interior optical path transmission region, said switch being in a fully-open mode when none of said independently movable light blocking structures are positioned within said interior optical path transmission region, and said switch being in a partially-closed mode when some but not all of said independently movable light blocking structures are at least partially positioned within said interior optical path transmission region.

21. The optical switch of claim 18, wherein each of said plurality of input fiber optical strands has one of a plurality of different optical inputs.

22. An optical switch for selectively blocking optical light signals provided from a plurality of input fiber optical strands, comprising:

(A) an input fiber termination port for coupling said plurality of input fiber optical strands to said optical switch, said input fiber termination port having a center and a plurality of rows of openings, each of said rows being aligned radially with respect to said center and having a plurality of openings for receiving ends of said input fiber optical strands;

(B) an output fiber termination port for coupling a plurality of output fiber optical strands to said optical switch;

(C) an interior optical path transmission region bounded on a first end by said input fiber termination port and on a second end by said output fiber termination port;

(D) a first movable light blocking structure positioned within said interior optical path transmission region for selectively blocking said optical signals from passing between input fiber optical strands positioned along at least one of said rows of said input fiber termination port and corresponding output fiber optical strands positioned in said output fiber termination port;

(E) a second movable light blocking structure which is rotationally offset from said first movable light blocking structure for selectively isolating individual ones of said rows of openings, said first and second light blocking structures being rotationally independent from each other; and (F) an electromechanical actuator for driving said first movable light blocking structure in step-wise angular increments, wherein said step-wise angular increments correspond to an angular distance between adjacent ones of said rows of openings in said input fiber termination port.

23. The optical switch of claim 22, wherein each of said plurality of input fiber optical strands has one of a plurality of different optical inputs.

24. A method for selectively blocking optical light signals provided from a plurality of input fiber optical strands with an optical switch, comprising the steps of:

(A) providing an input fiber termination port for coupling said plurality of input fiber optical strands to said optical switch, said input fiber termination port having a center and a plurality of rows of openings, each of said rows being aligned radially with respect to said center and having a plurality of openings for receiving ends of said input fiber Optical strands;

(B) providing an output fiber termination port for coupling a plurality of output fiber optical strands to said optical switch;

(C) providing an interior optical path transmission region bounded on a first end by said input fiber termination port and on a second end by said output fiber termination port; and (D) selectively moving, in step-wise angular increments, a first movable light blocking structure positioned within said interior optical path transmission region so as to block said optical signals from passing between input fiber optical strands positioned along at least one of said rows in said input fiber termination port and corresponding output fiber optical strands positioned in said output fiber termination port;

(E) selectively moving, in a step-wise manner, a second movable light blocking structure which is rotationally offset from said first light blocking structure in order to isolate individual ones of said rows of openings, said first and second light blocking structures being rotationally independent from each other;

wherein said step-wise angular increments correspond to an angular distance between adjacent ones of said rows of openings in said input fiber termination port.

25. The method of claim 24, wherein each of said plurality of input fiber optical strands has one of a plurality of different optical inputs.

* * * * *